(12) United States Patent
Narayanasamy et al.

(10) Patent No.: US 10,969,249 B2
(45) Date of Patent: Apr. 6, 2021

(54) CAPACITIVE SENSING BUTTON ON CHIP

(71) Applicant: Cypress Semiconductor Corporation, San Jose, CA (US)

(72) Inventors: Rajagopal Narayanasamy, Bangalore (IN); Mahadevan Krishnamurthy Narayana Swamy, Mysore (IN); David G. Wright, Woodinville, WA (US); Steve Kolokowsky, San Diego, CA (US)

(73) Assignee: Cypress Semiconductor Coproration, San Jose, CA (US)

( * ) Notice: Subject to any disclaimer, the term of this patent is extended or adjusted under 35 U.S.C. 154(b) by 542 days.

(21) Appl. No.: 15/433,932

(22) Filed: Feb. 15, 2017

(65) Prior Publication Data

US 2017/0255297 A1    Sep. 7, 2017

Related U.S. Application Data

(63) Continuation of application No. 14/632,191, filed on Feb. 26, 2015, now Pat. No. 9,588,626, which is a (Continued)

(30) Foreign Application Priority Data

Feb. 28, 2011    (IN) .............................. 530/DEL/2011

(51) Int. Cl.
*G01D 5/24*    (2006.01)
*G06F 3/044*    (2006.01)
(Continued)

(52) U.S. Cl.
CPC ........... *G01D 5/2405* (2013.01); *G06F 3/016* (2013.01); *G06F 3/0443* (2019.05);
(Continued)

(58) Field of Classification Search
CPC ....... G06F 3/044; G06F 3/016; G01D 5/2405; G01D 5/24; H03K 17/962; H03K 17/955;
(Continued)

(56) References Cited

U.S. PATENT DOCUMENTS 4,402,561 A * 9/1983 Grabbe ................ H05K 7/1023
439/66
7,952,366 B2 5/2011 Philipp et al.
(Continued)

FOREIGN PATENT DOCUMENTS

CN    101203821 A    6/2008
CN    101464758 A    6/2009
(Continued)

OTHER PUBLICATIONS

SIPO Chinese Office Action for International Application No. 2017103562362 dated Jul. 28, 2017; 1 pages.
(Continued)

*Primary Examiner* — Amy He

(57) ABSTRACT

A method, apparatus, and system use logic circuitry arranged within an integrated circuit to: convert a self capacitance of a first sensor element arranged within the integrated circuit to a digital value, and apply a signal to an output pin of the integrated circuit based on the self capacitance.

20 Claims, 14 Drawing Sheets

Related U.S. Application Data continuation of application No. 13/340,667, filed on Dec. 29, 2011, now Pat. No. 8,970,230.

(51) Int. Cl.
*H03K 17/96* (2006.01)
*G06F 3/01* (2006.01)
*H03K 17/60* (2006.01)

(52) U.S. Cl.
CPC ......... *G06F 3/0446* (2019.05); *H03K 17/962* (2013.01); *G06F 2203/04101* (2013.01); *G06F 2203/04106* (2013.01); *H03K 17/602* (2013.01); *H03K 2017/9602* (2013.01); *H03K 2217/960715* (2013.01); *H03K 2217/960725* (2013.01); *H03K 2217/960755* (2013.01)

(58) Field of Classification Search
CPC ........ H03K 2217/96074; G01F 3/0443; G01F 3/0446
See application file for complete search history.

(56) References Cited

U.S. PATENT DOCUMENTS

| | | | |
|---|---|---|---|
| 8,576,183 | B2 | 11/2013 | Rabenstein et al. |
| 8,970,230 | B2 | 3/2015 | Narayanasamy et al. |
| 2006/0197753 | A1 | 9/2006 | Hotelling |
| 2008/0111714 | A1* | 5/2008 | Kremin .................. G06F 3/044 341/33 |
| 2009/0027068 | A1 | 1/2009 | Philipp et al. |
| 2010/0194697 | A1 | 8/2010 | Hotelling et al. |
| 2011/0018829 | A1 | 1/2011 | Peng |
| 2013/0314109 | A1* | 11/2013 | Kremin .............. G01R 27/2605 324/686 |

FOREIGN PATENT DOCUMENTS

| | | |
|---|---|---|
| CN | 101715273 A | 5/2010 |
| CN | 101840296 A | 9/2010 |
| CN | 101896825 A | 11/2010 |
| CN | 102843122 A | 12/2012 |
| WO | 2006094308 A2 | 9/2006 |

OTHER PUBLICATIONS

SIPO Office Action for International Application 201210143563.7 dated Aug. 19, 2016; 3 pages.
SIPO Office Action for International Application 201210143563.7 dated Dec. 4, 2015; 7 pages.
USPTO Non Final Rejection for U.S. Appl. No. 13/340,667 dated Jul. 24, 2014; 10 pages.
USPTO Non-Final Rejection for U.S. Appl. No. 14/632,191 dated Jul. 27, 2016; 12 pages.
USPTO Notice of Allowance for U.S. Appl. No. 13/340,667 dated Dec. 17, 2014; 8 pages.
USPTO Notice of Allowance for U.S. Appl. No. 14/632,191 dated Oct. 24, 2016; 6 pages.
National Intellectual Property Administration, PRC Chinese Office Action for International Application No. 2017103562362 dated Mar. 30, 2020; 19 pages.
National Intellectual Property Administration, PRC Chinese Office Action for International Application No. 201710356236.2 dated Dec. 22, 2020; 14 pages.

* cited by examiner

US 10,969,249 B2

CAPACITIVE SENSING BUTTON ON CHIP

RELATED APPLICATIONS

This application is a continuation of U.S. patent application Ser. No. 14/632,191, filed on Feb. 26, 2015, which is a continuation of U.S. patent application Ser. No. 13/340,667, filed on Dec. 29, 2011, now U.S. Pat. No. 8,970,230, issued Mar. 3, 2015, which claims the benefit of priority from Indian Patent Application No. 530/DEL/2011, filed on Feb. 28, 2011, all of which are incorporated by reference herein in their entirety.

TECHNICAL FIELD

This disclosure relates to the field of touch-sensors and, in particular, to capacitive touch-sensing buttons.

BACKGROUND

Many electronic devices include a user interface device for allowing user interaction and user input. One user interface device is a button or a key. Conventional buttons include mechanical components to actuate a switch to indicate a button press or button activation. Mechanical buttons also provide a tactile feedback to the user to indicate the button has been pressed. More recently, touch-sensor buttons are being used in some applications to replace mechanical buttons. One type of touch-sensor button operates by way of capacitance sensing, utilizing capacitance sensor elements. The capacitance detected by a capacitance sensor changes as a function of the proximity of a conductive object on the sensor element. The conductive object can be, for example, a stylus or a user's finger. In a touch-sensor button, a change in capacitance detected by each sensor due to the proximity of a conductive object can be measured by a variety of methods. Regardless of the method, usually an electrical signal representative of the capacitance detected by each capacitance sensor is processed by a processing device, which in turn produces electrical or optical signals representative of the button or sensor activation of the touch-sensor button.

BRIEF DESCRIPTION OF THE DRAWINGS

The present disclosure is illustrated by way of example, and not by way of limitation, in the figures of the accompanying drawings.

DETAILED DESCRIPTION

The following description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in a simple block diagram format in order to avoid unnecessarily obscuring the present invention. Thus, the specific details set forth are merely exemplary. Particular implementations may vary from these exemplary details and still be contemplated to be within the spirit and scope of the present invention.

In many cases, replacing a mechanical button with a capacitive touch-sensor button may involve a major change in the layout of a printed circuit board (PCB) to include a sensor element, grounding pad, capacitance sensor, and other components such as LEDs. One embodiment of a capacitive touch-sensor button may be integrated such that a sensor element, grounding pad, capacitance sensor, and other components are contained within a single integrated circuit (IC) package. This approach can minimize the complexity in replacing a mechanical button with a capacitive touch-sensor button.

In one embodiment, an integrated capacitive touch-sensor button may include a ground pad and a sensor element attached within an integrated circuit package, and a capacitance sensor coupled with the ground pad and the sensor element. In one embodiment, the capacitance sensor is configured to measure a capacitance of the sensor element. The integrated circuit package may also have a ground pin and an output pin, both positioned at an exterior of the package to allow mounting on a PCB and connection to PCB traces. In one embodiment, the output pin may carry a signal depending on the capacitance measured from the sensor element. For example, the output pin may be connected to the ground pin or some other pin when the measured capacitance exceeds a threshold, or a signal may be generated and applied to the output pin that conveys information about the measured capacitance.

Figure 1:
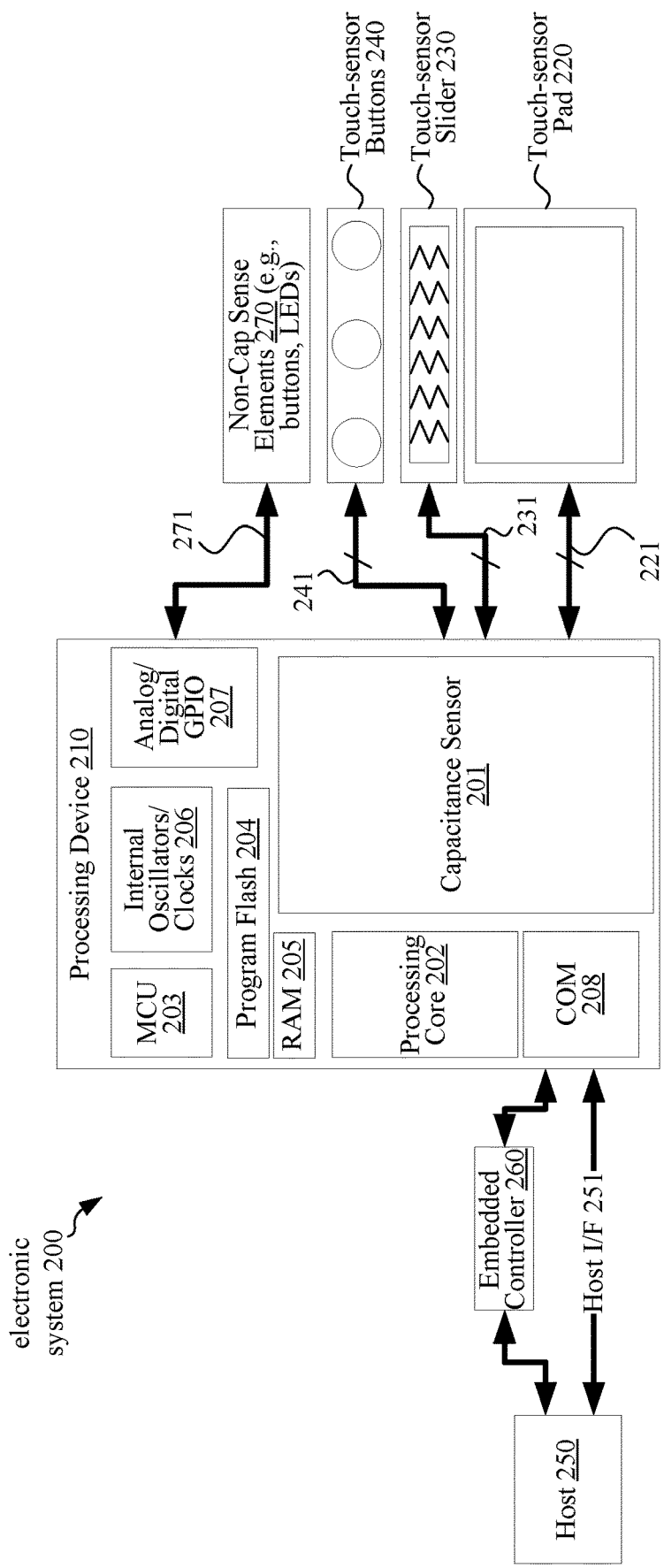
FIG. 1 is a block diagram illustrating an embodiment of an electronic system that processes touch sensor data.

FIG. 1 illustrates a block diagram of one embodiment of an electronic system having a processing device for detecting a presence of a conductive object. In one embodiment, components of electronic system 200 may be packaged into a single IC package for use as a capacitance sensing button. For example, the electronic system 200 may include a processing device 210 that is included within the same integrated circuit package as touch-sensor buttons 240, a touch-sensor slider 230, or a touch-sensor element 220. In one embodiment, the touch-sensor buttons 240, slider, 230, or element 220 may be mounted near a top surface of an integrated circuit package implementing a capacitive touch-sensing button.

In one embodiment, electronic system 200 may also include a host processor 250, embedded controller 260, and non-capacitance sensor elements 270. The processing device 210 may include analog and/or digital general purpose input/output ("GPIO") ports 207. GPIO ports 207 may be programmable. GPIO ports 207 may be coupled to a Programmable Interconnect and Logic ("PIL"), which acts as an interconnect between GPIO ports 207 and a digital block array of the processing device 210 (not illustrated). The digital block array may be configured to implement a variety of digital logic circuits (e.g., DAC, digital filters, digital control systems, etc.) using, in one embodiment, configurable user modules ("UMs"). The digital block array may be coupled to a system bus (not illustrated). Processing device 210 may also include memory, such as random access memory (RAM) 205 and program flash 204. RAM 205 may be static RAM (SRAM) or the like, and program flash 204 may be a non-volatile storage, or the like, which may be used to store firmware (e.g., control algorithms executable by processing core 202 to implement operations described herein). Processing device 210 may also include a memory controller unit (MCU) 203 coupled to memory and the processing core 202.

The processing device 210 may also include an analog block array (not illustrated). The analog block array is also coupled to the system bus. Analog block array also may be configured to implement a variety of analog circuits (e.g., ADC, analog filters, etc.) using, in one embodiment, configurable UMs. The analog block array may also be coupled to the GPIO 207.

As illustrated, capacitance sensor 201 may be integrated into processing device 210. Capacitance sensor 201 may include analog I/O for coupling to an external component, such as touch-sensor element 220, touch-sensor slider 230, touch-sensor buttons 240, and/or other devices. Capacitance sensor 201 and processing device 202 are described in more detail below.

It should be noted that the embodiments described herein are not limited to touch-sensor buttons (e.g., capacitance sensing button), but can be used in other capacitive sensing implementations, for example, the sensing device may be a touch-sensor slider 230, or a touch-sensor element 220. Similarly, the operations described herein are not limited to notebook operations, but can include other operations, such as lighting control (dimmer), volume control, graphic equalizer control, speed control, or other control operations requiring gradual or discrete adjustments. It should also be noted that these embodiments of capacitive sensing implementations may be used in conjunction with non-capacitive sensing elements, including but not limited to pick buttons, sliders (ex. display brightness and contrast), scroll-wheels, multi-media control (ex. volume, track advance, etc) and numeric keypad operation.

The electronic system 200 includes a touch-sensor element 220 coupled to the processing device 210 via bus 221. Touch-sensor element 220 may include a two-dimension sensor array. The two-dimension sensor array includes multiple sensor elements, organized as rows and columns. The electronic system 200 includes a touch-sensor slider 230 coupled to the processing device 210 via bus 231. Touch-sensor slider 230 may include a single-dimension sensor array. The single-dimension sensor array includes multiple sensor elements, organized as rows, or alternatively, as columns. The electronic system 200 includes touch-sensor buttons 240 coupled to the processing device 210 via bus 241. Touch-sensor button 240 may include a single-dimension or multi-dimension sensor array. The single- or multi-dimension sensor array includes multiple sensor elements. For a touch-sensor button, the sensor elements may be coupled together to detect a presence of a conductive object over the entire surface of a touch-sensing panel. Alternatively, the touch-sensor button 240 has a single sensor element to detect the presence of the conductive object. In one embodiment, the touch-sensor button 240 may be a capacitance sensor element. Capacitance sensor elements may be used as noncontact sensor element. These sensor elements, when protected by an insulating layer, offer resistance to severe environments.

The electronic system 200 may include any combination of one or more of the touch-sensor element 220, touch-sensor slider 230, and/or touch-sensor button 240. In another embodiment, the electronic system 200 may also include non-capacitance sensor elements 270 coupled to the processing device 210 via bus 271. The non-capacitance sensor elements 270 may include mechanical buttons, light emitting diodes (LEDs), and other user interface devices, such as a mouse, a keyboard, or other functional keys that do not require capacitance sensing. In one embodiment, buses 271, 241, 231, and 221 may be a single bus. Alternatively, these buses may be configured into any combination of one or more separate buses.

The processing device may also provide value-added functionality such as keyboard control integration, LEDs, battery charger and general purpose I/O, as illustrated as non-capacitance sensor elements 270. Non-capacitance sensor elements 270 are coupled to the GPIO 207.

Processing device 210 may include internal oscillator/clocks 206 and communication block 208. The oscillator/clocks block 206 provides clock signals to one or more of the components of processing device 210. Communication block 208 may be used to communicate with an external component, such as a host processor 250, via host interface (I/F) line 251. Alternatively, processing block 210 may also be coupled to embedded controller 260 to communicate with the external components, such as host 250. Interfacing to the host 250 can be through various methods. The processing device 210 may communicate to external components, such as the host 250 using industry standard interfaces, such as USB, PS/2, inter-integrated circuit (I2C) bus, or system packet interfaces (SPI). The host 250 and/or embedded controller 260 may be coupled to the processing device 210 with a ribbon or flex cable from an assembly, which houses the sensing device and processing device.

In one embodiment, the processing device 210 is configured to communicate with the embedded controller 260 or the host 250 to send and/or receive data. The data may be a command or alternatively a signal.

In one embodiment, the processing device 210 may operate to communicate data (e.g., commands or signals) using hardware, software, and/or firmware, and the data may be communicated directly to the processing device of the host 250, such as a host processor, or alternatively, may be communicated to the host 250 via drivers of the host 250, such as OS drivers, or other non-OS drivers. It should also be noted that the host 250 may directly communicate with the processing device 210 via host interface 251.

In one embodiment, the data sent to the host 250 include the position or location of the conductive object on the sensing device. Alternatively, other user interface device commands may be communicated to the host 250 from the processing device 210. These commands may be based on gestures occurring on the sensing device that are recognized by the processing device, such as tap, push, hop, drag, and zigzag gestures. Alternatively, other commands may be recognized. Similarly, signals may be sent that indicate the recognition of these operations.

In particular, a tap gesture, for example, may be when the finger (e.g., conductive object) is on the sensing device for less than a threshold time. If the time the finger is placed on the touchpad is greater than the threshold time it may be considered to be a movement of the pointer, in the x- or y-axes. In another embodiment, the touch-sensor button may be activated when a capacitance of a sensor element of the touch-sensor button exceeds a presence threshold. Alternatively, the touch-sensor button may be activated when a tap gesture is recognized on the touch-sensor button.

Processing device 210 may reside on a common carrier substrate such as, for example, an integrated circuit (IC) die substrate, a multi-chip module substrate, or the like. Alternatively, the components of processing device 210 may be one or more separate integrated circuits and/or discrete components. In one exemplary embodiment, processing device 210 may be a Programmable System on a Chip (PSOC™) processing device, manufactured by Cypress Semiconductor Corporation, San Jose, Calif. Alternatively, processing device 210 may be one or more other processing devices known by those of ordinary skill in the art, such as a microprocessor or central processing unit, a controller, special-purpose processor, digital signal processor (DSP), an application specific integrated circuit (ASIC), a field programmable gate array (FPGA), or the like. In an alternative embodiment, for example, the processing device may be a network processor having multiple processors including a core unit and multiple microengines. Additionally, the processing device may include any combination of general-purpose processing device(s) and special-purpose processing device(s).

It should also be noted that the embodiments described herein are not limited to having a configuration of a processing device coupled to a host, but may include a system that measures the capacitance on the sensing device and sends the raw data to a host computer where it is analyzed by an application. In effect the processing that is done by processing device 210 may also be done in the host.

In one embodiment, the method and apparatus described herein may be implemented in a fully self-contained sensing device (including the processing device), which outputs fully processed x/y movement and gesture data signals or data commands or finger presence indications to a host. In another embodiment, the method and apparatus may be implemented in a sensing device, which outputs positional data, gesture data, and/or finger presence data to a host, and where the host processes the received data to detect gestures. In another embodiment, the method and apparatus may be implemented in a sensing device, which outputs raw capacitance data to a host, where the host processes the capacitance data to compensate for quiescent and stray capacitance, and calculates positional information, detects the presence of the conductive object and/or detects gestures by processing the capacitance data. Alternatively, the method and apparatus may be implemented in a sensing device, which outputs pre-processed capacitance data to a host, where the sensing device processes the capacitance data to compensate for quiescent and stray capacitance, and the host calculates positional information, detects presence of the conductive object, and/or detects gestures from the pre-processed capacitance data.

Capacitance sensor 201 may be integrated into the processing device 210. Alternatively, descriptions of capacitance sensor 201 may be generated and compiled for incorporation into other integrated circuits. For example, behavioral level code describing capacitance sensor 201, or portions thereof, may be generated using a hardware descriptive language, such as VHDL or Verilog, and stored to a machine-accessible medium (e.g., Flash ROM, CD-ROM, hard disk, floppy disk, etc.). Furthermore, the behavioral level code can be compiled into register transfer level ("RTL") code, a netlist, or even a circuit layout and stored to a machine-accessible medium. The behavioral level code, the RTL code, the netlist, and the circuit layout all represent various levels of abstraction to describe capacitance sensor 201.

It should be noted that the components of electronic system 200 may include all the components described above. Alternatively, electronic system 200 may include only some of the components described above, or include additional components not listed herein.

In one embodiment, electronic system 200 may be used in a notebook computer. Alternatively, the electronic device may be used in other applications, such as a mobile handset, a personal data assistant (PDA), a keyboard, a television, a set-top box, a remote control, a monitor, a handheld multimedia device, a handheld video player, a handheld gaming device, a kitchen appliance (such as a refrigerator, oven, stove-top, dishwasher), laundry appliance (washer or dryer) test and measurement instrument, medical instrument or a control panel.

In one embodiment, capacitance sensor 201 may be a capacitive switch relaxation oscillator (CSR). The CSR may be coupled to an array of sensor elements using a current-programmable relaxation oscillator, an analog multiplexer, digital counting functions, and high-level software routines to compensate for environmental and physical sensor element variations. The sensor array may include combinations of independent sensor elements, sliding sensor elements (e.g., touch-sensor slider), and touch-sensor sensor element pads (e.g., touch pad) implemented as a pair of orthogonal sliding sensor elements. The CSR may include physical, electrical, and software components. The physical component may include the physical sensor element itself, typically a pattern formed from a leadframe or other sheet metal used in IC package construction, or constructed on a printed circuit board (PCB), with an insulating cover, a flexible membrane, or a transparent overlay. The electrical component may include an oscillator or other means to convert a charged capacitance into a measured signal. The electrical component may also include a counter or timer to measure the oscillator output. The software component may include detection and compensation software algorithms to convert the count value into a sensor element detection decision (also referred to as switch detection decision). For example, in the case of slider sensor elements or X-Y touch-sensor sensor element pads, a calculation for finding position of the conductive object to greater resolution than the physical pitch of the sensor elements may be used.

It should be noted that there are various methods for measuring capacitance. Although some embodiments described herein are described using a relaxation oscillator, the present embodiments are not limited to using relaxation oscillators, but may include other methods, such as current versus voltage phase shift measurement, resistor-capacitor charge timing, capacitive bridge divider, charge transfer, sigma-delta modulators, charge-accumulation circuits, or the like.

The current versus voltage phase shift measurement may include driving the capacitance through a fixed-value resistor to yield voltage and current waveforms that are out of phase by a predictable amount. The drive frequency can be adjusted to keep the phase measurement in a readily measured range. The resistor-capacitor charge timing may include charging the capacitor through a fixed resistor and measuring timing on the voltage ramp. Small capacitance values may require very large resistors for reasonable timing. The capacitive bridge divider may include driving the capacitor under test through a fixed reference capacitor. The reference capacitor and the capacitor under test form a voltage divider. The voltage signal is recovered with a synchronous demodulator, which may be done in the processing device 210. The charge transfer may be conceptually similar to an R-C charging circuit. In this method, $C_P$ is the capacitance being sensed. $C_{SUM}$ is the summing capacitor, into which charge is transferred on successive cycles. At the start of the measurement cycle, the voltage on $C_{SUM}$ is reset. The voltage on $C_{SUM}$ increases exponentially (and only slightly) with each clock cycle. The time for this voltage to reach a specific threshold is measured with a counter. Additional details regarding these alternative embodiments have not been included so as to not obscure the present embodiments, and because these alternative embodiments for measuring capacitance are known by those of ordinary skill in the art.

Figure 2:
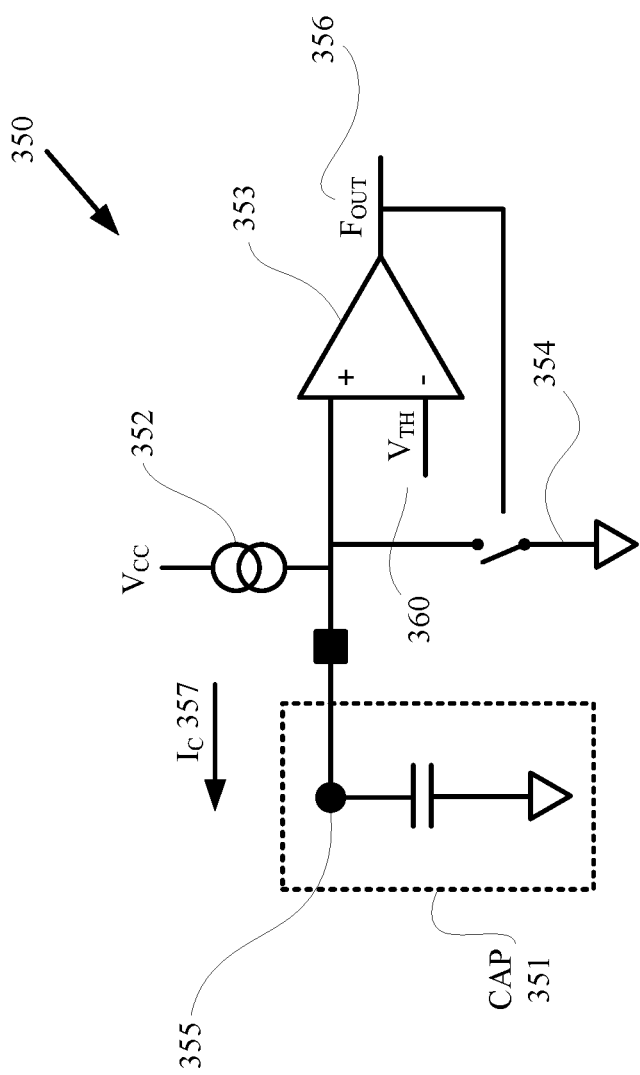
FIG. 2 illustrates an embodiment of a relaxation oscillator for measuring a capacitance on a sensor element.

FIG. 2 illustrates one embodiment of a relaxation oscillator for measuring a capacitance on a sensor element 351. The relaxation oscillator 350 is formed by the capacitance to be measured on sensor element 351 (represented as capacitor 351), a charging current source 352, a comparator 353, and a reset switch 354 (also referred to as a discharge switch). It should be noted that capacitor 351 is representative of the capacitance measured on a sensor element. The sensor element and the one or more surrounding grounded conductors may be metal, or alternatively, the conductors may be conductive ink (e.g., carbon ink) or conductive polymers. The relaxation oscillator is coupled to drive a charging current (Ic) 357 in a single direction onto a device under test ("DUT") capacitor, capacitor 351. As the charging current piles charge onto the capacitor 351, the voltage across the capacitor increases with time as a function of Ic 357 and its capacitance C. Equation (1) describes the relation between current, capacitance, voltage, and time for a charging capacitor.

$$CdV=I_c dt \quad \text{(Equation 1)}$$

The relaxation oscillator begins by charging the capacitor 351, at a fixed current Ic 357, from a ground potential or zero voltage until the voltage across the capacitor 351 at node 355 reaches a reference voltage or threshold voltage, $V_{TH}$ 360. At the threshold voltage $V_{TH}$ 360, the relaxation oscillator allows the accumulated charge at node 355 to discharge (e.g., the capacitor 351 to "relax" back to the ground potential) and then the process repeats itself. In particular, the output of comparator 353 asserts a clock signal $F_{OUT}$ 356 (e.g., $F_{OUT}$ 356 goes high), which enables the reset switch 354. This discharges the voltage on the capacitor at node 355 to ground and the charge cycle starts again. The relaxation oscillator outputs a relaxation oscillator clock signal ($F_{OUT}$ 356) having a frequency ($f_{RO}$) dependent upon capacitance C of the capacitor 351 and charging current Ic 357.

The comparator trip time of the comparator 353 and reset switch 354 add a fixed delay. The output of the comparator 353 is synchronized with a reference system clock to guarantee that the reset time is long enough to completely discharge capacitor 351. This sets a practical upper limit to the operating frequency. For example, if capacitance C of the capacitor 351 changes, then $f_{RO}$ changes proportionally according to Equation 1. By comparing $f_{RO}$ of $F_{OUT}$ 356 against the frequency ($f_{REF}$) of a known reference system clock signal (REF CLK), the change in capacitance ($\Delta C$) can be measured. Accordingly, Equations 2 and 3 below describe that a change in frequency between $F_{OUT}$ 356 and REF CLK is proportional to a change in capacitance of the capacitor 351.

$$\Delta C \propto \Delta f, \text{ where} \quad \text{(Equation 2)}$$

$$\Delta f = f_{RO} - f_{REF} \quad \text{(Equation 3)}$$

In one embodiment, a frequency comparator may be coupled to receive relaxation oscillator clock signal ($F_{OUT}$ 356) and REF CLK, compare their frequencies $f_{RO}$ and $f_{REF}$, respectively, and output a signal indicative of the difference $\Delta f$ between these frequencies. By monitoring $\Delta f$, one can determine whether the capacitance of the capacitor 351 has changed.

In one exemplary embodiment, the relaxation oscillator 350 may be built using a programmable timer to implement the comparator 353 and reset switch 354. Alternatively, the relaxation oscillator 350 may be built using other circuiting. Relaxation oscillators are known by those of ordinary skill in the art, and accordingly, additional details regarding their operation have not been included so as to not obscure the present embodiments. The capacitor charging current for the relaxation oscillator 350 may be generated in a register programmable current output DAC (also known as IDAC). Accordingly, the current source 352 may be a current DAC or IDAC. The IDAC output current may be set by an 8-bit value provided by the processing device 210, such as from the processing core 202. The 8-bit value may be stored in a register or in memory.

In many capacitance sensor element designs, the two "conductors" of the sensing capacitor are actually adjacent sensor elements that are electrically isolated (e.g., PCB pads or traces). Typically, one of these conductors is connected to a system ground. Layouts for touch-sensor slider (e.g., linear slide sensor elements) and touch-sensor pad applications have sensor elements that may be immediately adjacent. In these cases, all of the sensor elements that are not active are connected to a system ground through the GPIO 207 of the processing device 210 dedicated to that pin. The actual capacitance between adjacent conductors is small (Cp), but the capacitance of the active conductor (and its PCB trace back to the processing device 210) to ground, when detecting the presence of the conductive object 303, may be considerably higher (Cp+Cf). The capacitance of two adjacent conductors is given by the following equation:

$$C = \varepsilon_0 \cdot \varepsilon_R \cdot \frac{A}{d} = \varepsilon_R \cdot 8.85 \cdot \frac{A}{d} pF/m \qquad \text{(Equation 4)}$$

The dimensions of Equation 4 are in meters. This is a very simple model of the capacitance. The reality is that there are fringing effects that substantially increase the sensor element-to-ground (and PCB trace-to-ground) capacitance.

Sensor element sensitivity (i.e., activation distance) may be increased by one or more of the following: 1) increasing substrate thickness to increase the distance between the active sensor element and any parasitics; 2) minimizing PCB trace routing underneath sensor elements; 3) utilizing a gridded ground with 50% or less fill if use of a ground plane is absolutely necessary; 4) increasing the spacing between sensor element pads and any adjacent ground plane; 5) increasing pad area; 6) decreasing thickness of any insulating overlay; 7) using higher dielectric constant material in the insulating overlay; or 8) verifying that there is no air-gap between the PCB pad surface and the touching finger.

There is some variation of sensor element sensitivity as a result of environmental factors. A baseline update routine, which compensates for this variation, may be provided in the high-level APIs.

As described above with respect to the relaxation oscillator 350, when a finger or conductive object is placed on the sensor element, the capacitance increases from Cp to Cp+Cf so the relaxation oscillator output signal 356 ($F_{OUT}$) decreases. The relaxation oscillator output signal 356 ($F_{OUT}$) may be fed to a digital counter for measurement. There are two methods for counting the relaxation oscillator output signal 356: frequency measurement and period measurement. Additional details of the relaxation oscillator and digital counter are known by those of ordinary skill in the art, and accordingly a detailed description regarding them have not been included. It should also be noted, that the embodiments described herein are not limited to using relaxation oscillators, but may include other sensing circuitry for measuring capacitance, such as versus voltage phase shift measurement, resistor-capacitor charge timing, capacitive bridge divider, charge transfer, sigma-delta modulators, charge-accumulation circuits, or the like.

Figure 3:
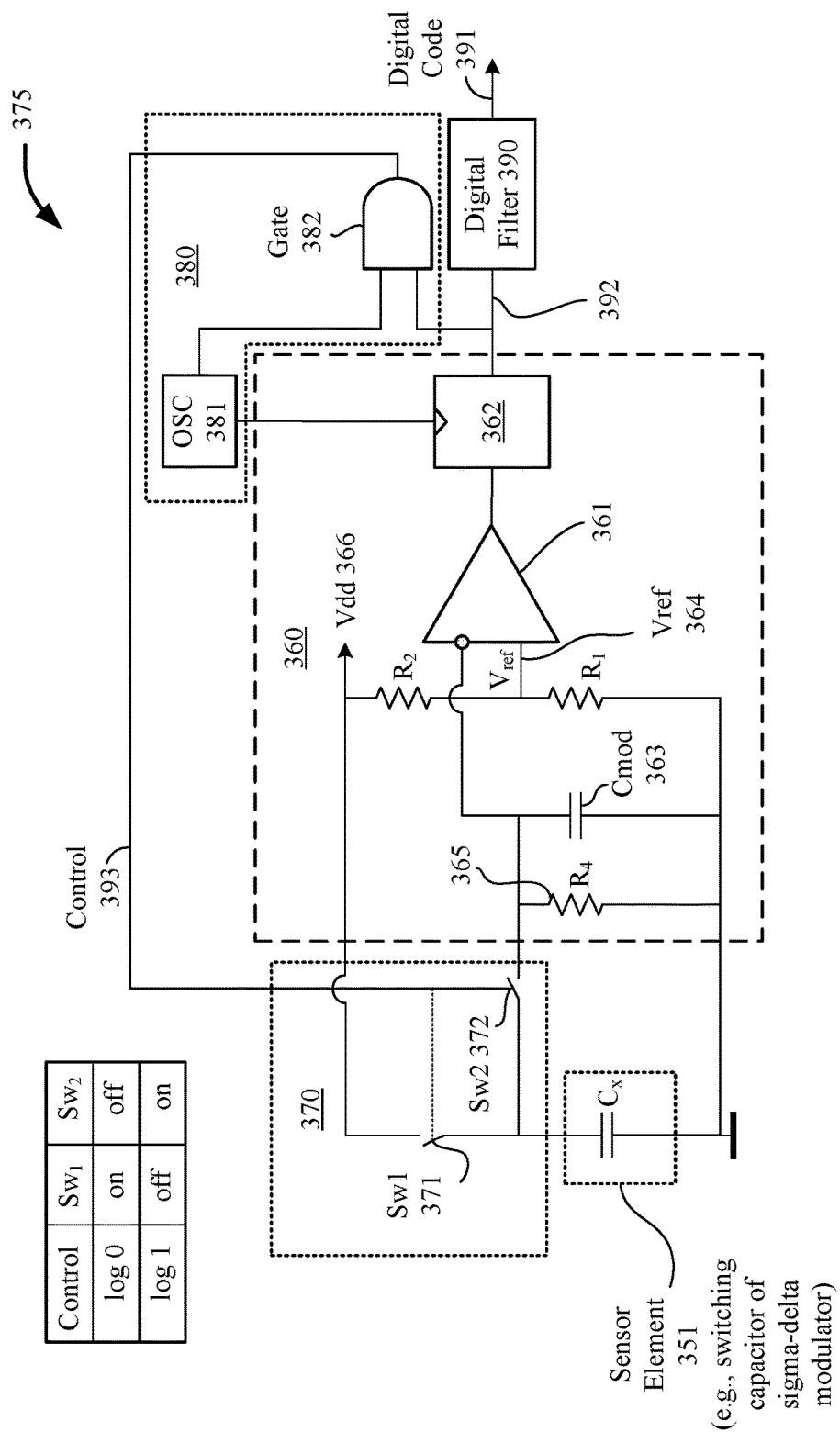
FIG. 3 illustrates a schematic of an embodiment of a circuit including a sigma-delta modulator and a digital filter for measuring capacitance of a sensor element.

FIG. 3 illustrates a schematic of one embodiment of a circuit 375 including a sigma-delta modulator 360 and a digital filter 390 for measuring capacitance on a sensor element 351. Circuit 375 includes a switching circuit 370, switching clock source 380, sigma-delta modulator 360, and digital filter 390 for measuring the capacitance on sensor element 351. Sensor element 351 may be a used for a touch-sensor button, and is represented as a switching capacitor Cx in the modulator feedback loop. Switching circuit 370 includes two switches SW1 371 and SW2 372. The switches SW1 371 and SW2 372 operate in two, non-overlapping phases (also known as break-before-make configuration). These switches together with sensing capacitor Cx 351 form the switching capacitor equivalent resistor, which provides the modulator capacitor Cmod 363 of sigma-delta modulator 360 charge current (as illustrated in FIG. 3B) or discharge current (not illustrated) during one of the two phases.

The sigma-delta modulator 360 includes the comparator 361, latch 362, modulator capacitor Cmod 363, modulator feedback resistor 365, which may also be referred to as bias resistor 365, and voltage source 366. The output of the comparator may be configured to toggle when the voltage on the modulator capacitor 363 crosses a reference voltage 364. The reference voltage 364 may be a pre-programmed value, and may be configured to be programmable. The sigma-delta modulator 360 also includes a latch 362 coupled to the output of the comparator 361 to latch the output of the comparator 361 for a given amount of time, and provide as an output, output 392. The latch may be configured to latch the output of the comparator based on a clock signal from the gate circuit 382 (e.g., oscillator signal from the oscillator 381). In another embodiment, the sigma-delta modulator 360 may include a synchronized latch that operates to latch an output of the comparator for a pre-determined length of time. The output of the comparator may be latched for measuring or sampling the output signal of the comparator 361 by the digital filter 390.

Sigma-delta modulator 360 is configured to keep the voltage on the modulator capacitor 363 close to reference voltage Vref 364 by alternatively connecting the switching capacitor resistor (e.g., switches SW1 371 and SW2 372 and sensing capacitor Cx 351) to the modulator capacitor 363. The output 392 of the sigma-delta modulator 360 (e.g., output of latch 362) is feedback to the switching clock circuit 380, which controls the timing of the switching operations of switches SW1 371 and SW2 372 of switching circuit 370. For example, in this embodiment, the switching clock circuit 380 includes an oscillator 381 and gate 382. Alternatively, the switching clock circuit 380 may include a clock source, such as a spread spectrum clock source (e.g., pseudo-random signal (PRS)), a frequency divider, a pulse width modulator (PWM), or the like. The output 392 of the sigma-delta modulator 360 is used with an oscillator signal to gate a control signal 393, which switches the switches Sw1 371 and SW2 372 in a non-overlapping manner (e.g., two, non-overlapping phases). The output 392 of the sigma-delta modulator 360 is also output to digital filter 430, which filters and/or converts the output into the digital code 391.

In one embodiment of the method of operation, at power on, the modulator capacitor 363 has zero voltage and switching capacitor resistor (formed by sensing capacitor Cx 351, and switches SW1 371 and SW2 372) is connected between Vdd line 366 and modulator capacitor 363. This connection allows the voltage on the modulator capacitor 363 to rise. When this voltage reaches the comparator reference voltage, Vref 364, the comparator 361 toggles and gates the control signal 393 of the switches Sw1 371 and SW2 372, stopping the charge current. Because the current via bias resistors Rb, 365 continues to flow, the voltage on modulator capacitor 363 starts dropping. When it drops below the reference voltage 364, the output of the comparator 361 switches again, enabling the modulator 363 to start charging. The latch 362 and the comparator 361 set sample frequency of the sigma-delta modulator 360.

The digital filter 390 is coupled to receive the output 392 of the sigma-delta modulator 360. The output 392 of the sigma-delta modulator 360 may be a single bit bitstream, which can be filtered and/or converted to the numerical values using a digital filter 390. In one embodiment, the digital filter 390 is a counter. In another embodiment, the standard Sinc digital filter can be used. In another embodiment, the digital filter is a decimator. Alternatively, other digital filters may be used for filtering and/or converting the output 392 of the sigma-delta modulator 360 to provide the digital code 391. It should also be noted that the output 392 may be output to the decision logic 402 or other components of the processing device 210, or to the decision logic 451 or other components of the host 250 to process the bitstream output of the sigma-delta modulator 360.

Described below are the mathematical equations that represent the operations of FIG. 3. During a normal operation mode, the sigma-delta modulator 360 keeps these currents equal in the average by keeping the voltage on the modulator 363 equal to, or close to, the reference voltage Vref 364. The current of the bias resistor Rb 365 is:

$$I_{Rb} = \frac{V_{cmod}}{R_b} \quad \text{(Equation 5)}$$

The sensing capacitor Cx 351 in the switched-capacitor mode has equivalent resistance:

$$R_c = \frac{1}{f_s C_x} \quad \text{(Equation 6)}$$

where $f_s$ is the operation frequency of the switches (e.g., switching circuit 370). If the output 392 of the sigma-delta modulator 360 has a duty cycle of $d_{mod}$, the average current of the switching capacitor 351 can be expressed in the following Equation 7:

$$I_c = d_{mod}\frac{V_{dd} - V_{Cmod}}{R_c} \quad \text{(Equation 7)}$$

In the operation mode, $$I_{Rb} = I_c, V_{Cmod} = V_{ref} \text{ or: } \frac{V_{ref}}{R_b} = d_{mod}\frac{V_{dd} - V_{ref}}{R_c} \quad \text{(Equation 8)}$$

or taking into account that the reference voltage 364 is part of supply voltage:

$$V_{ref} = k_d V_{dd}; k_d = \frac{R_1}{R_1 + R_2} \quad \text{(Equation 9)}$$

The Equation (5) can be rewritten in the following form:

$$d_{mod} = \frac{R_c}{R_b}\frac{k_d}{1 - k_d} = \frac{1}{f_s R_b}\frac{k_d}{1 - k_d}\frac{1}{C_x} \quad \text{(Equation 10)}$$

The Equation 10 determines the minimum sensing capacitance value, which can be measured with the proposed method at given parameters set:

$$d_{mod} \leq 1, \text{ or: } C_{xmin} = \frac{1}{f_s R_b}\frac{k_d}{1 - k_d} \quad \text{(Equation 11)}$$

The resolution of this method may be determined by the sigma-delta modulator duty cycle measurement resolution, which is represented in the following equations:

$$\Delta d_{mod} = \beta\frac{\Delta C_x}{C_x^2}; \quad \text{(Equation 12)}$$

$$\beta = \frac{1}{f_s R_b}\frac{k_d}{1 - k_d}$$

or after rewriting relatively □Cx, we obtain:

$$\Delta C_x = \frac{1}{\beta}\Delta d_{mod} C_x^2 \quad \text{(Equation 13)}$$

In one exemplary embodiment, the resistance of the bias resistor 365 is 20 K Ohms (Rb=20 k), the operation frequency of the switches is 12 MHz ($f_s$=12 MHz), the capacitance on the switching capacitor 351 is 15 picofarads (Cx=15 pF), and the ratio between Vdd 366 and the voltage reference 364 is 0.25 (kd=0.25), the duty cycle has a 12-bit resolution and the capacitance resolution is 0.036 pF.

In some embodiments of capacitive sensing applications, it may be important to get fast data measurements. For example, the modulator can operate at sample frequency 10 MHz (period is 0.1 microseconds (□s)), for the 12-bit resolution sample, and digital filter as single-type integrator/counter the measurement time is approximately 410 □s (e.g., $2^{12}$×0.1 □s=410 □s). For faster measurement speeds at same resolutions, other types of digital filters may be used, for example, by using the Sinc2 filter, the scanning time at the same resolution may be reduced approximately 4 times. To do this the sensing method should have suitable measurement speed. In one embodiment, a good measurement rate may be accomplished by using a double integrator as the digital filter 390.

Figure 4:
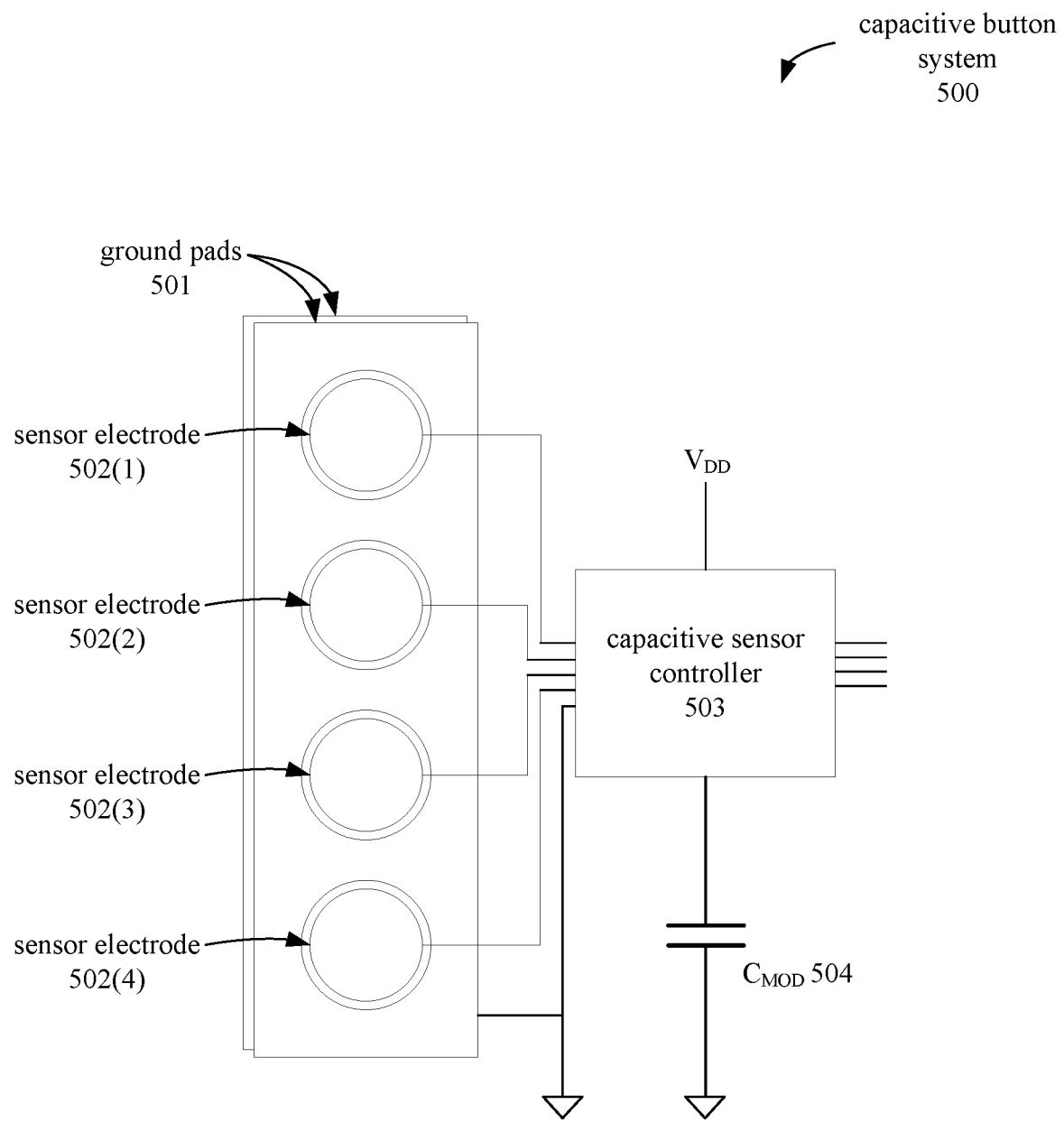
FIG. 4 is a block diagram illustrating a capacitive button system, according to an embodiment.

FIG. 4 illustrates an embodiment of a capacitive button system 500 including a capacitance sensor controller 503 configured to measure capacitances from a set of capacitive touch-sensing buttons. In one embodiment, the capacitance sensor controller 503 measures capacitances using a modulation capacitor $C_{MOD}$ 504. In one embodiment, $C_{MOD}$ 504 may perform similarly as capacitor 363, as illustrated in FIG. 3.

In one embodiment, the capacitive touch-sensing buttons include a ground pad 501 and sensor electrodes 502(1)-502(4) that are located outside of an integrated package containing the controller 503. For example, the sensor electrodes 502 may be constructed on a top layer of a PCB. One ground pad may be constructed on the top layer of the PCB, surrounding the sensor electrodes 502, while another ground plane may be constructed on a bottom layer of the PCB, underneath the sensor electrodes 502 and the first ground plane.

For a capacitive button system such as system 500, the separate components, such as the ground pads 501, sensor electrode 502, and modulation capacitor $C_{MOD}$ 504 may occupy space on a PCB layout in addition to the space occupied by controller 503. The system 500 may occupy yet more space in the PCB layout to include components such as LEDs to indicate a status of the button.

Figure 5:
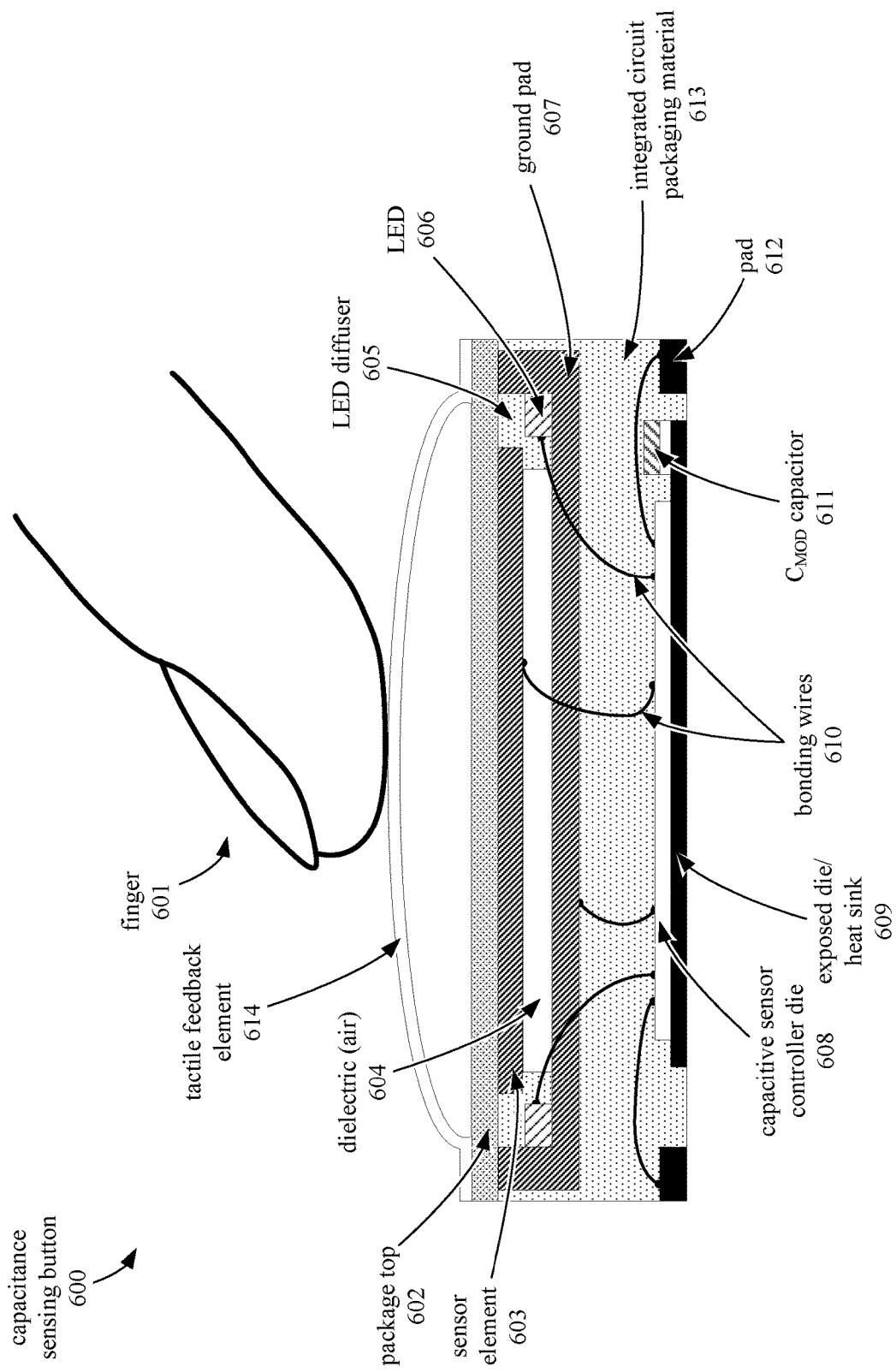
FIG. 5 illustrates an embodiment of a capacitive sensing button.

FIG. 5 illustrates one embodiment of a capacitance sensing button 600 that is integrated into a single integrated circuit package. In one embodiment, a capacitance sensing button integrated into a single package may be used to easily replace a mechanical button with minimal changes to layout and routing. For example, the capacitance sensing button 600 may be used on a multi-layer board without affecting the routing of internal layers. In one embodiment, the integrated circuit may implement one button; alternatively, the integrated circuit may implement multiple buttons. The capacitive sensing button 600 may be made into rectangular, circular, or other shapes.

An embodiment of an integrated circuit device implementing a capacitive sensing button 600 may include an integrated circuit package made from integrated circuit packaging material 613, such as an epoxy resin, silicone resin, plastic, or other mold compound. In one embodiment, the top 602 of the integrated circuit may be made from the same packaging material. In one embodiment the top 602 may be used as an overlay over the sensor element 603 and ground pad 607 to protect the sensor element 603 and ground pad 607. In an alternative embodiment, the package top 602 may be made from a different material than the packaging material 613.

The capacitance sensing button 600 may also include, attached within the integrated circuit package, a capacitive sensor controller die 608, the ground element 607, and the sensor element 603. In one embodiment, the ground pad 607 and sense element 603 may be constructed from a conductive material such as copper.

In one embodiment, air may be used as a dielectric between the ground pad 607 and sensor element 603. This arrangement may increase the sensitivity of the capacitive sensor formed by the sensor element 603 and the ground pad 607, relative to an arrangement that uses a different dielectric material.

In one embodiment, glass frit sealing may be used to seal an air gap between the sensor element 603 and the ground pad 607. In one embodiment, the glass frit may follow the edges of sensor element 603, lying between the sensor element 603 and ground pad 607.

In one embodiment, the sensor element 603 may be placed above the ground pad 607, while outside edges of the ground pad 607 rise to surround the edges of the sensor element 603. For example, the ground pad 607 may be constructed in a tray shape, with the sensor element 603 positioned within the tray, as illustrated in FIG. 5. Thus, the ground pad 607 substantially surrounds every side of the sensor element 603 except the top surface of sensor element 603.

In one embodiment, the capacitance sensing button 600 includes a capacitance sensor that performs functions similar to capacitance sensor 201, as illustrated in FIG. 1. The capacitance sensor may be implemented as part of a capacitive sensor controller 608. In one embodiment, capacitive sensor controller die 608 may be mounted near the bottom of the integrated circuit package.

In one embodiment, the capacitive sensor controller die 608 may have an exposed surface 609 at a bottom surface of the integrated circuit package, so that the exposed die surface 609 may act as a heat sink to conduct heat away from the interior of the chip.

In one embodiment, the capacitance sensor implemented in the capacitive sensor controller 608 may be connected to both the ground pad 607 and the sensor element 603 via bonding wires such as wires 610. The bonding wires 610 may also connect the capacitive sensor controller 608 with other components within the integrated circuit package. In one embodiment, the capacitive sensor controller 608 is configured to perform the operations for measuring a capacitance of the sensor element. For example, the capacitive sensor controller may operate in similar fashion as processing device 210, as illustrated in FIGS. 1 and 4.

In one embodiment, the capacitance sensor in the capacitive sensor controller 608 may cause a particular signal to be applied to an output pin based on the measured capacitance. For example, the capacitance sensor may detect the proximity of a conductive object such as finger 601 near the exterior surface of the integrated circuit package under which the sensor element 603 lies, and in response to detecting the proximity of the object, the capacitance sensor may cause an increase or decrease in resistance between the output pin and another pin. Alternatively, the capacitance sensor may cause an active signal to be applied to the output pin. In one embodiment, the output pin may carry a signal indicating a magnitude of the capacitance change, proximity of the conductive object, or other metric.

In one embodiment, the output pin may be implemented using a pad, such as pad 612, which is constructed from a conductive material that is exposed at an exterior surface of the integrated circuit package. The pad 612 may be connected to the capacitive sensor controller 608 by one or more of the bonding wires 610.

In one embodiment, the capacitance sensing button 600 may also include a modulation capacitor $C_{MOD}$ 611 coupled with the capacitive sensor controller 608 and attached within the integrated circuit package. In one embodiment, the capacitor $C_{MOD}$ 611 may operate in similar fashion as a modulation capacitor such as Cmod 363, as illustrated in FIG. 3. In one embodiment, the modulation capacitor 611 and/or other passive components may be integrated inside the integrated circuit package so that the capacitance sensing button 600 does not require additional external components, as compared to a mechanical button. Alternatively, such passive components may be integrated in the chip 608 itself.

In one embodiment, the capacitive sensing button 600 may include a tactile feedback element 614. As illustrated in FIG. 5, the tactile feedback element 614 may overlay the top 602 of the integrated circuit package. In one embodiment, the tactile feedback element 614 may be designed to provide a tactile stimulus then touched or pressed. For example, the tactile feedback element 614 may be implemented by a plastic dome that clicks in response to pressure applied by a finger or other object. Alternatively, the tactile feedback element 614 may be a static form that includes raised ridges or bumps to allow a user to locate the capacitance sensing button 600 by touch. In one embodiment, the tactile feedback element 614 may be made from metal, or from a plastic such as polyester. In one embodiment, the tactile feedback element 614 may be made from polyester with a conductive paint or ink on the inner layer of the tactile feedback element 614 to increase the sensitivity of the capacitive sensing button.

In one embodiment, the tactile feedback element 614 may serve a dual purpose as additional electrostatic discharge (ESD) shielding. For example, the tactile feedback element 614 may be coated with a conductive material, such as silver paint, that may be grounded.

In one embodiment, the top 602 of the integrated circuit package or the tactile feedback element 614 may have a surface capable of accepting ink or printing, such that symbols or other markers may be printed directly on the button 600.

One embodiment of the capacitance sensing button 600 may further include lighting to indicate a status of the button 600. For example, such a button 600 may light depending on various conditions, such as when the proximity of a conductive object, such as finger 601, is detected, or when the button 600 is powered on. In one embodiment, an LED 606 may be connected via one of the bonding wires 610 to the capacitive sensor controller 608, and the illumination of the LED 606 may be controlled by the capacitive sensor controller 608. In one embodiment, the LED 606 may be one of a number of LEDs located within the integrated circuit package.

In one embodiment, the LED 606 may be mounted to face an upper surface of the button 600. In one embodiment, a diffuser 605 made from a transparent or translucent material may be positioned over the LED 606 to diffuse light from the LED 606. In one embodiment, the package top 602 and tactile feedback element 614 may be transparent or translucent to allow the light from LED 606 to pass through. Alternatively, these elements may have gaps to allow the light from LED 606 to pass.

Figure 6:
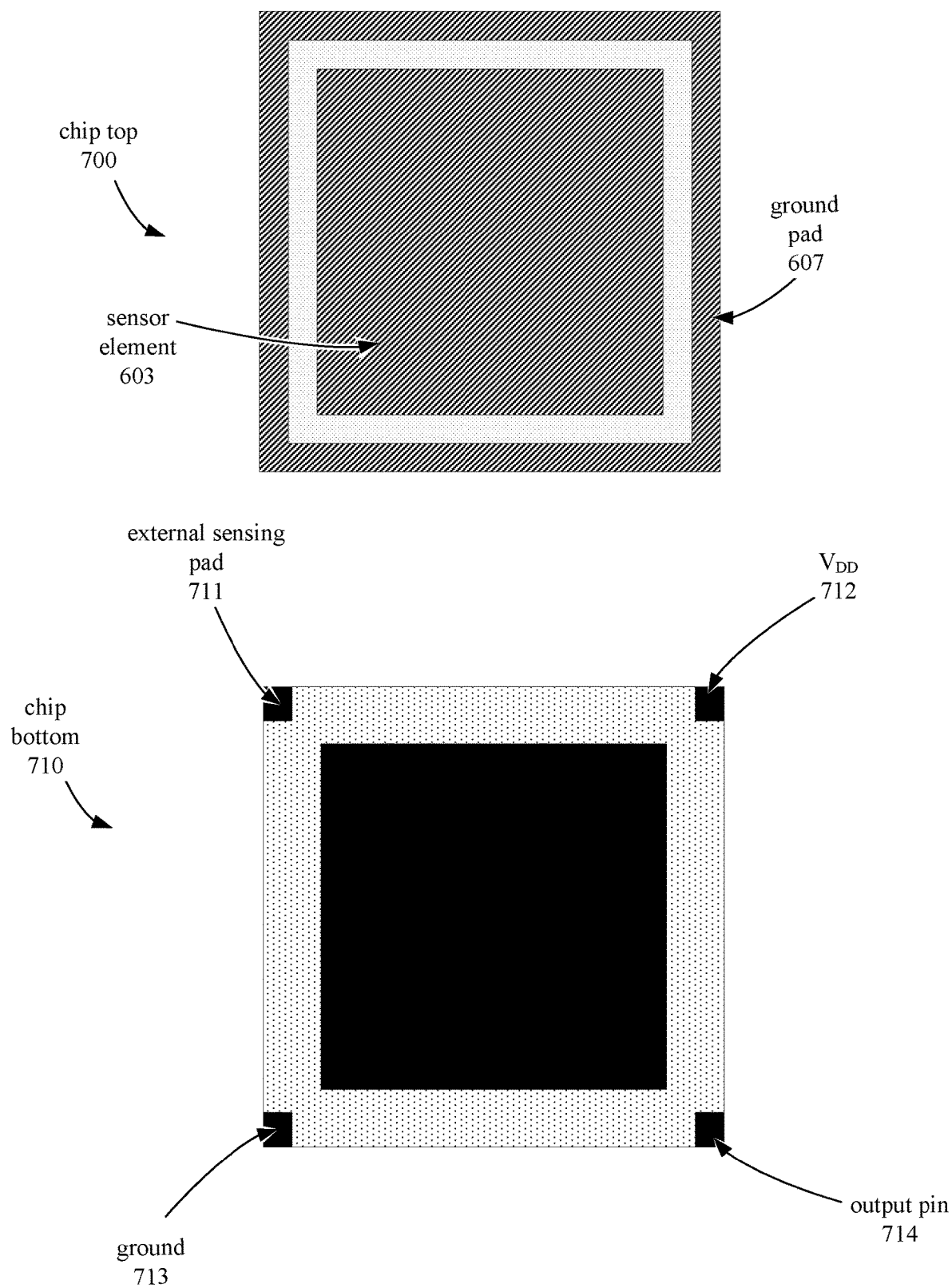
FIG. 6 illustrates top and bottom views of a capacitive sensing button integrated circuit, according to an embodiment.

FIG. 6 illustrates the top 700 and bottom 710 of the capacitance sensing button integrated circuit chip 600, according to one embodiment. The components at the top surface 700 of the chip include the sensor element 603 and a top edge of the ground pad 607 that surrounds the sensor element 603. The visible edge of the ground pad 607 may also be connected to a conductive plane (not illustrated in FIG. 6) under the sensor element 603. This conductive plane may make up the remainder of the ground pad 607.

In one embodiment, the ground pin 713 comprises an exposed conductor at a bottom or side surface of the integrated circuit package. In one embodiment, the ground pin 713 may be connected to the ground pad 607, and to the capacitive sensor controller 608. The ground pin 713 may be used to connect a ground potential from a host device to the ground pad 607 and the capacitive sensor controller 608.

In one embodiment, a $V_{DD}$ pin 712 which comprises an exposed conductor at the bottom surface of the integrated circuit package may be used to supply power to the integrated circuit chip.

In one embodiment, an output pin 714 is situated at the bottom 710 of the integrated circuit chip, and may carry a signal based on a capacitance measured from a sensor element 603. In one embodiment, the pin 714 may carry a signal that indicates a proximity of a conductive object to the sensor element 603.

In one embodiment, a capacitance sensor that may be implemented in a capacitive sensor controller 608 may be configured to decrease a resistance between the output pin 714 and another pin at an exterior surface of the integrated circuit package. For example, the output pin 714 may be connected to ground 713 in response to the capacitance sensor detecting a conductive object near the sensor element 603, or detecting a change in capacitance between the sensor element 603 and the ground pad 607. Alternatively, the output pin 714 may be connected to another pin, such as $V_{DD}$ 712.

In one embodiment, the capacitance sensor may apply a signal to the output pin 714 in response to a measured capacitance or a change in capacitance by connecting the output pin 714 to a signal source. For example, the capacitance sensor may cause the output pin 714 to be connected to some internal signal source, such as a signal generator or buffer in response to detecting a change in capacitance or in response to detecting the proximity of a conductive object. Alternatively, the capacitance sensor may cause a change in a signal already being applied to the output pin 714 at the time that a change in capacitance is detected.

In one embodiment, the integrated circuit package may include a pin 711 for connecting to an external sense element. In one embodiment, an external sense element connected to the pin 711 may be used as a reference sensor for detecting a button press when powering on a device in which the capacitive button integrated circuit is implemented.

Figure 7A:
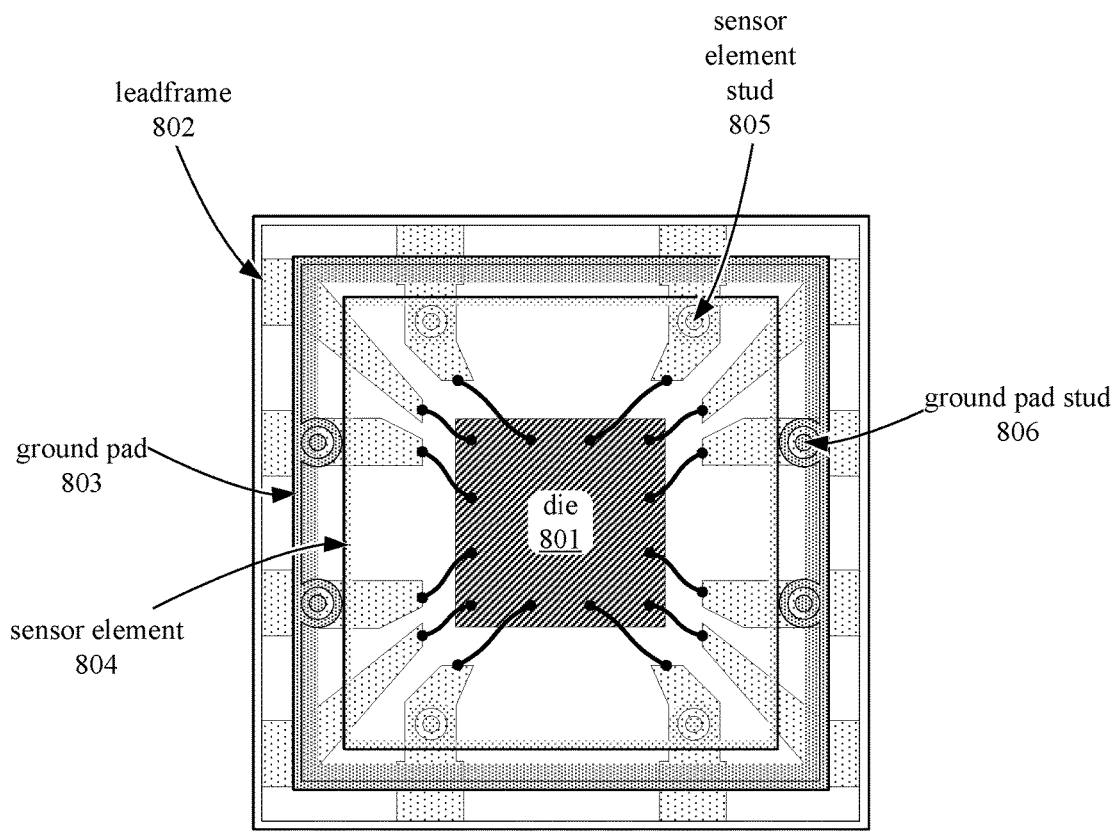
FIG. 7A illustrates a top view of a capacitive sensor button integrated circuit, according to an embodiment.
Figure 7B:
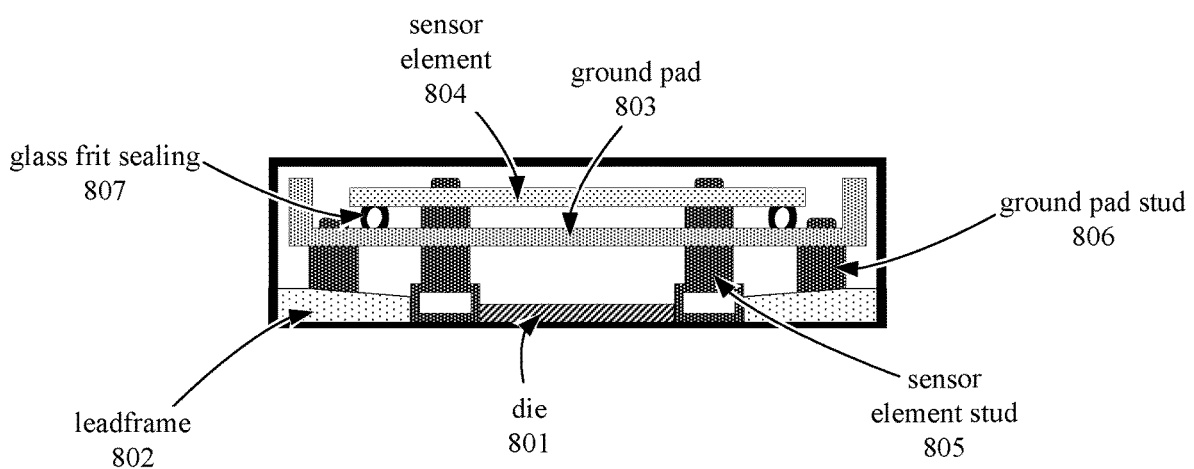
FIG. 7B illustrates a side view of a capacitive sensor button integrated circuit, according to an embodiment.

FIGS. 7A and 7B illustrate an embodiment of a capacitive button integrated circuit including a die 801 that includes a capacitive sensor controller similar to controller 608, as illustrated at FIG. 5. The integrated circuit includes a leadframe 802 that is includes a number of leads each connected to the die 801 via bonding wires. Above, the leadframe 802 and the die 801, a ground pad 803 and a sensor element 804 are mounted. In one embodiment, the ground pad is connected to one or more of the leads of leadframe 802 through one or more ground pad studs, such as stud 806. The leadframe is connected to die 801, thus connecting the ground pad 803 to the die 801. Similarly, studs such as the sensor element stud 805 may be used to connect the sensor element 804 to the leadframe 802, and thus to the die 801.

In one embodiment, the studs such as studs 805 and 806 may also hold the ground pad 803 and sensor element 802 in place, such that the ground pad 803 substantially surrounds the sensor element 802 on all sides except the top of sensor element 802.

In one embodiment, glass frit sealing is used to seal an air space in between the sensor element 804 and the ground pad 803. The air space may then function as a dielectric between the sensor element 804 and the ground pad 803 to increase the sensitivity of the capacitive sensor button. In one embodiment, the package material of the chip itself can be used as a dielectric, instead of air, to increase the sensitivity. In such an embodiment, the glass frit sealing may not be required.

Figure 8:
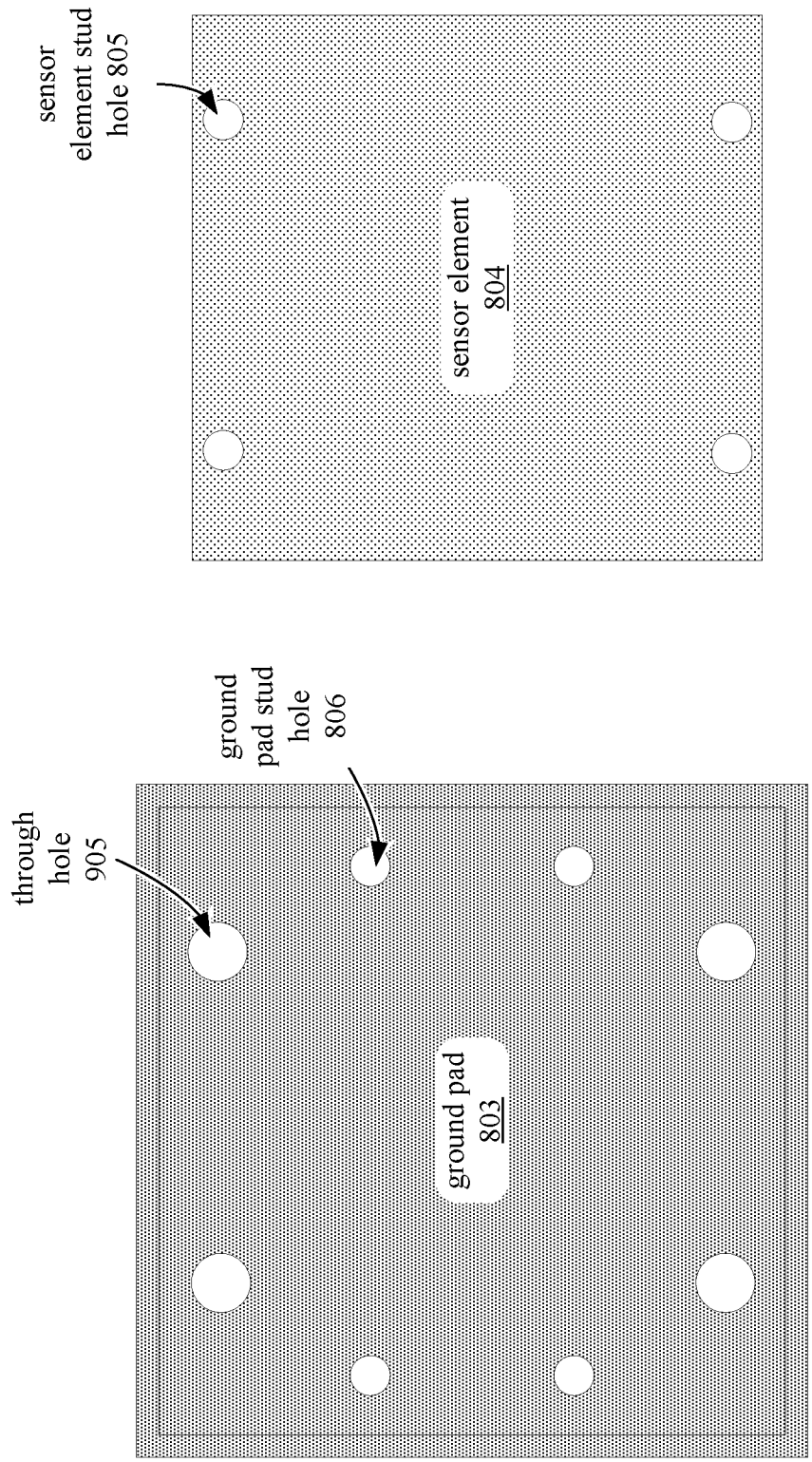
FIG. 8 illustrates a ground pad and a sensor element for a capacitive sensor button integrated circuit, according to an embodiment.

FIG. 8 illustrates top views of the ground pad 803 and the sensor element 804 of the capacitive sensor button in a disassembled state. The ground pad 803 includes four through holes 905 through which the sensor element studs can pass without electrically connecting to the ground pad 803. For example, a sensor element stud may pass through hole 905 and connect to the sensor element 804 at sensor element stud hole 805. Thus, the sensor element 804 may be supported above the ground pad 803 by the sensor element studs connected at the four sensor element stud holes, while the ground pad 803 is supported by additional ground pad studs connected at the ground pad stud holes, such as hole 806.

Figure 9A:
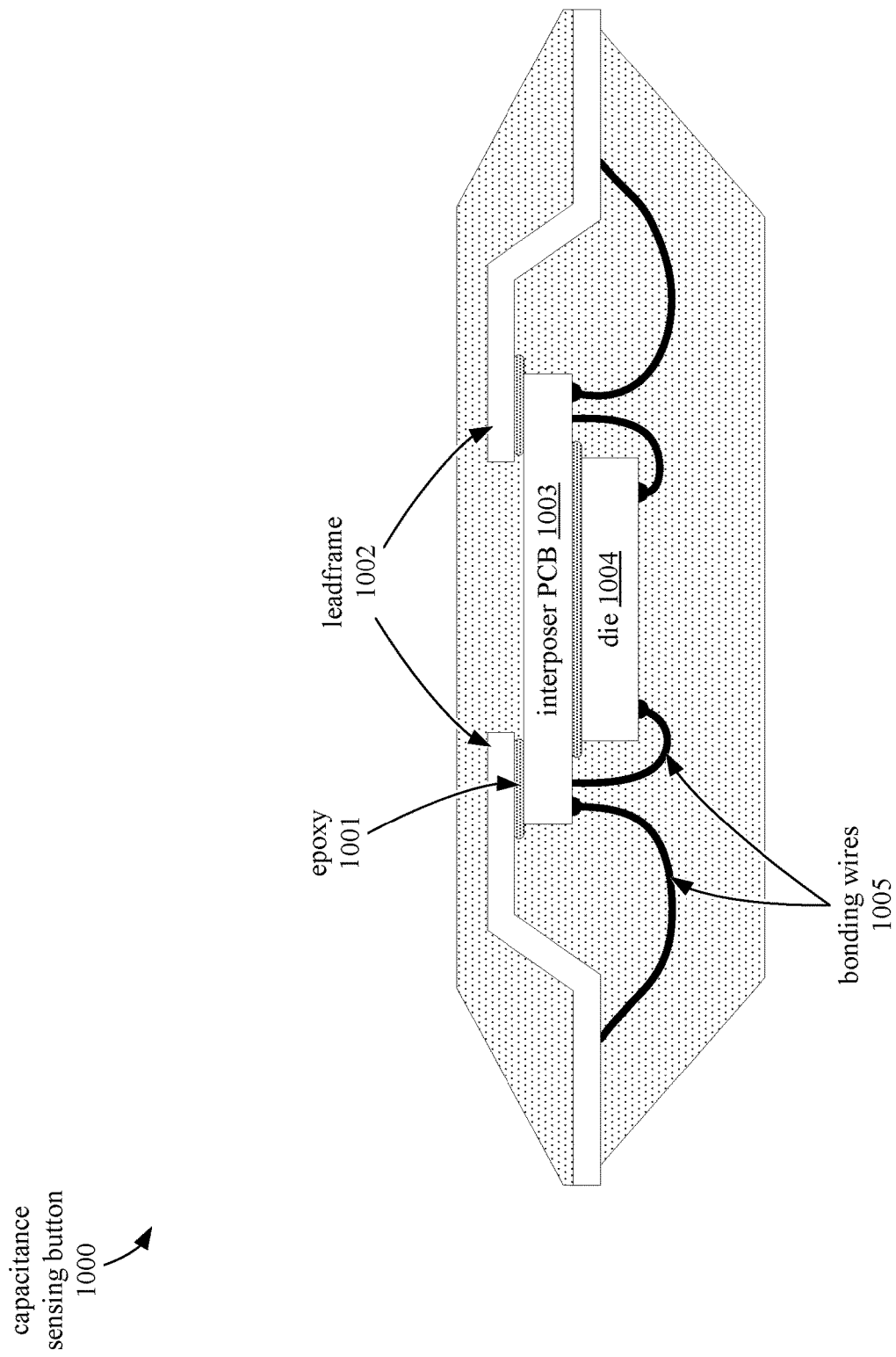
FIG. 9A illustrates capacitance sensing button integrated circuit, according to an embodiment.

FIG. 9A illustrates an embodiment of a capacitance sensing button 1000 in an integrated circuit chip that includes an interposer PCB 1003 for supporting a die 1004. In one embodiment, the die 1004 may contain the capacitive sensor controller, and may thus operate in similar fashion as die 801 and 608. In one embodiment, the die 1004 is mounted on the underside of the interposer PCB 1003. The interposer PCB may in turn be affixed to the leadframe 1002 with epoxy 1001.

Figure 9B:
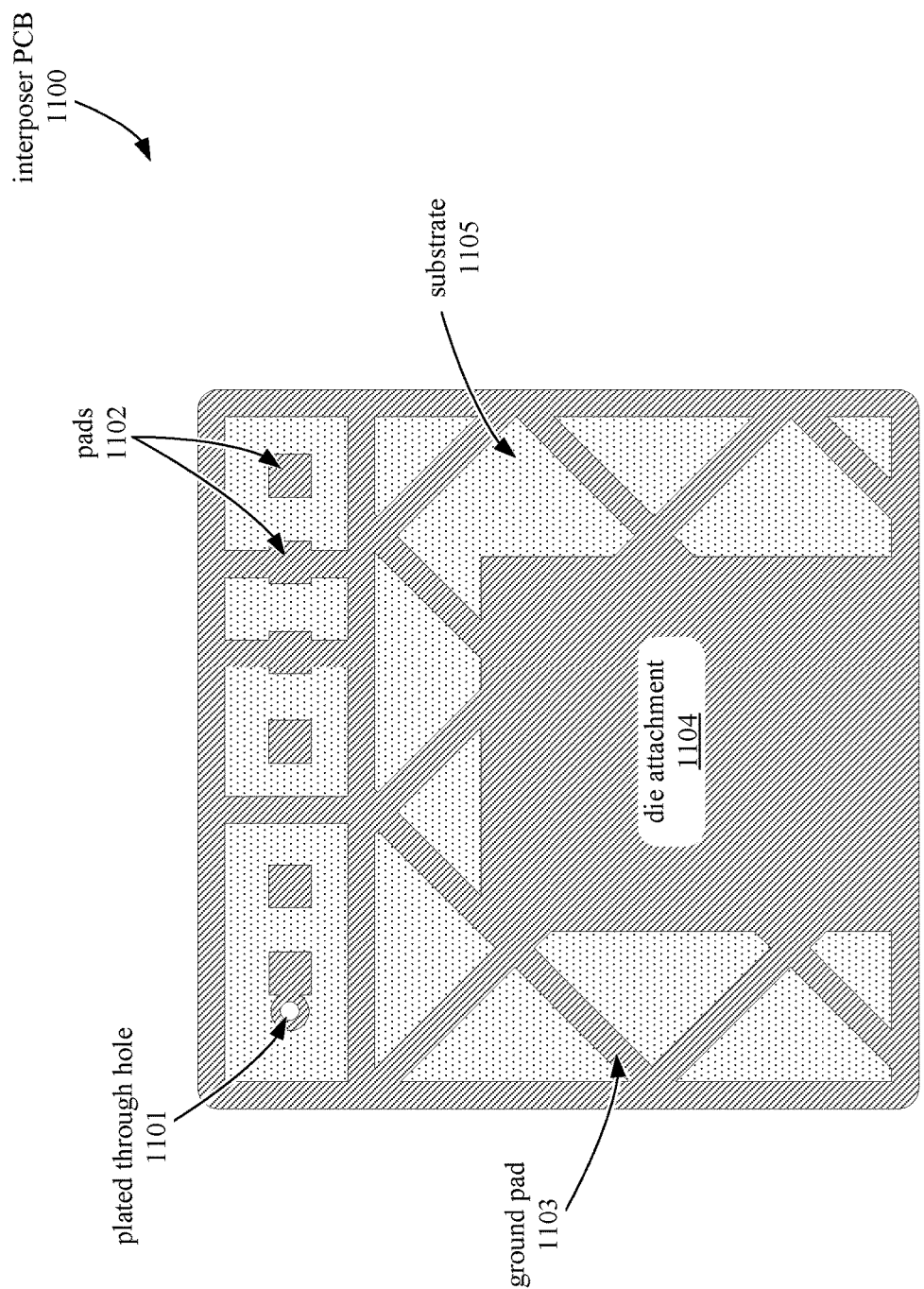
FIG. 9B illustrates an interposer printed circuit board (PCB) for a capacitance sensing button integrated circuit, according to an embodiment.

In one embodiment, a ground pad may be constructed on the interposer PCB as illustrated in FIG. 9B. Interposer PCB 1100 may include a substrate 1105 onto which a ground pad 1103 is constructed from a layer of conductive material. In one embodiment, the interposer PCB includes a die attachment area 1104 for attaching a die, such as die 1004, along with pads 1102 for attaching one or more passive electrical components, such as capacitors or resistors. In one embodiment, a modulator capacitor similar to capacitor 611 or capacitor 363 may be attached at pads 1102. In one embodiment, the interposer PCB 1100 may also have one or more through holes. For example, plated through hole 1101 may provide a path for a bonding wire to connect a die 1004 with a sensor element above the interposer PCB 1100.

In one embodiment, a capacitive sensor button integrated circuit device may implement more than one sensor element, which may be used to determine a direction of movement of a conductive object, such as a finger, in proximity to the sensor elements. Such a device may include a capacitive sensor controller that is configured to measure capacitances from the sensor elements, determine the direction of movement of the conductive object based on the measured capacitances, and signal the direction of movement via an output pin at the exterior of the integrated circuit package.

Figure 10A:
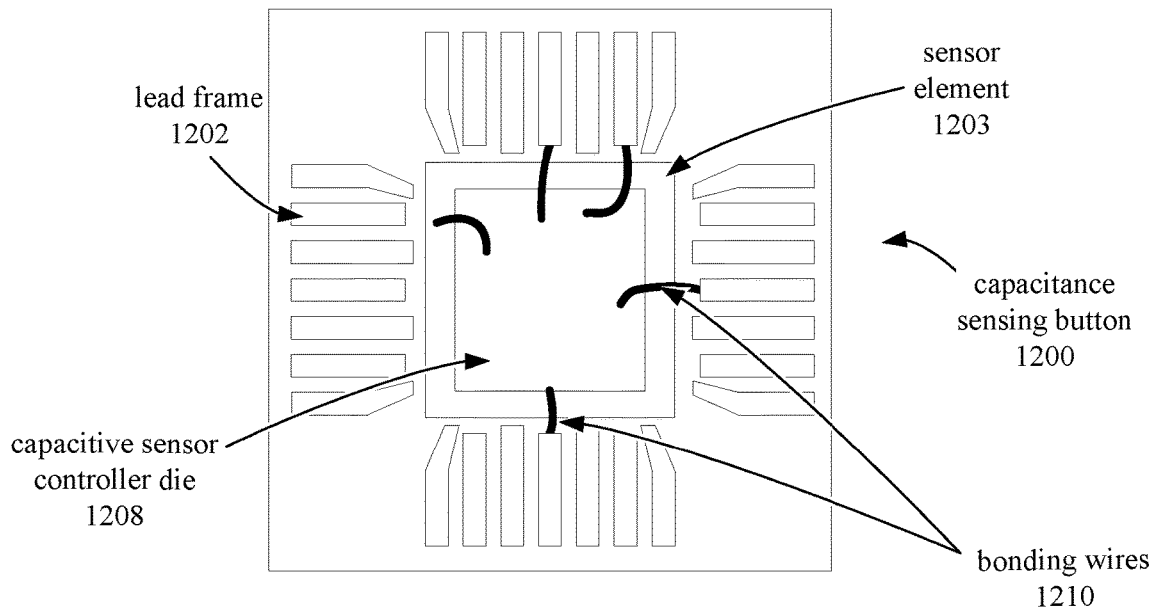
FIG. 10A illustrates a top view of a capacitance sensing button, according to an embodiment.

FIG. 10A illustrates a top view of a capacitance sensing button 1200, according to an embodiment. This view of the button 1200 illustrates the arrangement of various components of the button 1200, including the lead frame 1202, which includes multiple conductors spaced around the edge of the button package, the sensor element 1203, and the capacitive sensor controller die 1208. In one embodiment, bond pads of the controller die 1208 may be electrically connected to the lead frame 1202 and to the sensor element 1203 via bonding wires, such as bonding wires 1210. In one embodiment, the controller die 1208 and the sensor element 1203 may be centrally located in the button package.

Figure 10B:
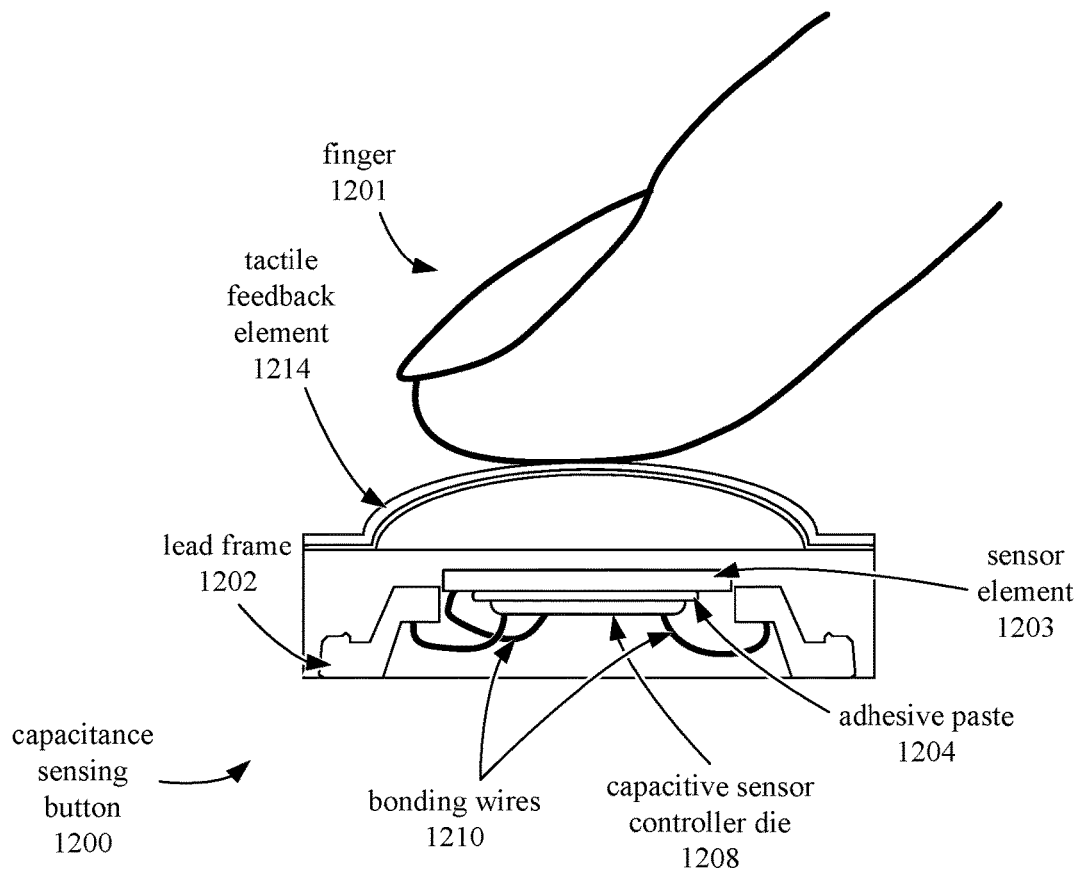
FIG. 10B illustrates a side view of a capacitance sensing button, according to an embodiment.

FIG. 10B illustrates a side view of a capacitance sensing button 1200, according to an embodiment. As previously illustrated in FIG. 10A, capacitance sensing button 1200 includes a controller die 1208 that is connected via bonding wires 1210 to a lead frame 1202 and a sensor element 1203. In one embodiment, the controller die 1208 may also be mounted to the sensor element 1203 using a non-conductive adhesive paste 1204. A tactile feedback element 1214 may be overlaid on top of the button 1200, and may provide tactile feedback to a finger 1201 that presses down on the feedback element 1214. In one embodiment, the underside of the tactile feedback element 1214 may be coated with a conductive material to increase the sensitivity of the capacitive sensing button 1200.

Figure 11A:
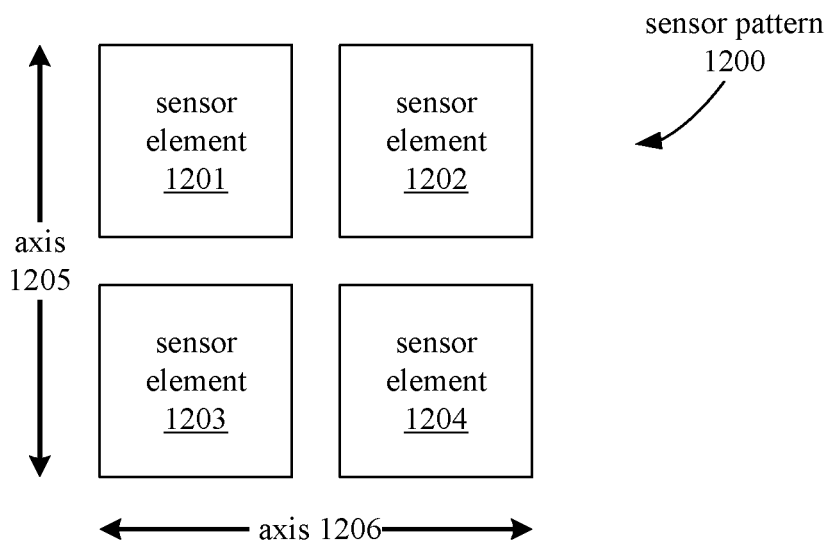
FIG. 11A illustrates a sensor pattern for a capacitance sensing button integrated circuit, according to an embodiment.

FIG. 11A illustrates a pattern 1200 for a set of sensor elements 1201-1204 that may be used in a capacitive sensor button integrated circuit. In particular, a sensor pattern such as sensor pattern 1200 may be optimized for self-capacitance measurements.

In one embodiment, the sensor elements 1201-1204 may be arranged in a grid arrangement so that each of the sensor elements 1201-1204 may be aligned with another of the sensor elements 1201-1204 along a first axis and aligned with yet another sensor element along a second axis. For example, the sensor element 1201 is aligned with sensor element 1203 in the direction of axis 1205, and is also aligned with sensor element 1202 in the direction of axis 1206. In one embodiment, the sensor elements 1201-1204 together may be situated with respect to a ground pad in a similar fashion as the single sensor element 603, as illustrated in FIG. 5.

In one embodiment, the sensor pattern 1200 having multiple sensor elements 1201-1204 may detect movement of a conductive object in proximity to the sensor elements 1201-1204 by detecting the changes in capacitances on each of the elements 1201-1204.

Figure 11B:
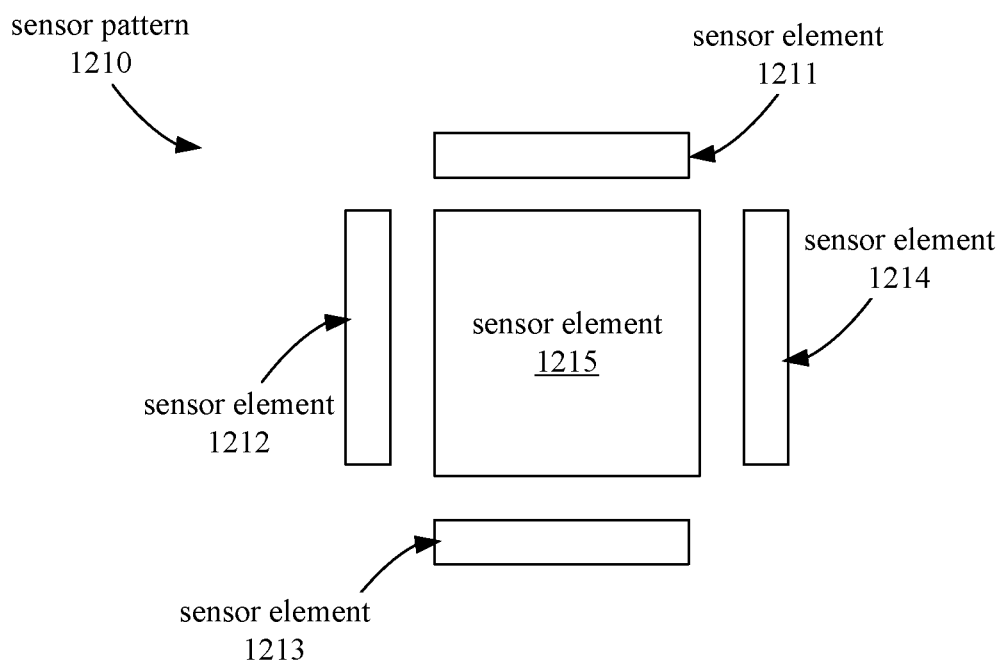
FIG. 11B illustrates a sensor pattern for a capacitance sensing button integrated circuit, according to an embodiment.

FIG. 11B illustrates an embodiment of a sensor pattern 1210 that may be used with a capacitive button integrated circuit that is configured to perform mutual capacitance sensing between sensor elements. The sensor pattern 1210 is radially symmetrical, including a subset of sensor elements 1211-1214 arranged radially around a central sensor element 1215. In one embodiment, each of the sensor elements 1211-1214 is aligned with the central sensor element 1215 on a radial axis extending from the central sensor element 1215.

In one embodiment, the mutual capacitance between a TX electrode and an RX electrode can be sensed to detect the presence of a finger or other conductive object that disturbs an electric field between the TX and RX electrodes. When a conductive object, such as a finger, approaches the electric field between the TX and RX electrodes, the object may cause a decrease in the measured mutual capacitance between the electrodes. For example, if a finger is placed near the gap between a transmit electrode and a receive electrode, the presence of the finger will decrease the charge coupled between the electrodes. Thus, in one embodiment, a location of the finger on or near an array of sensor electrodes can be determined by identifying the one or more receive electrodes having a decrease in measured mutual capacitance in addition to identifying the transmit electrode to which the TX signal was applied at the time the decrease in capacitance was measured on the one or more receive electrodes.

In one embodiment, a capacitance sensor may be configured to measure a mutual capacitance between each of the radial sensor elements 1211-1214 and the central sensor element 1215 by applying a transmit (TX) signal to each of the plurality of radial sensor elements 1211-1214 in sequence, and receiving an RX signal from the central sensor element 1215. In an alternative embodiment, the radial sensor elements 1211-1214 may be used as RX sensor elements while the central sensor element 1215 is used as a TX sensor element. In one embodiment, the TX sensor elements may be grounded when not being driven with a TX signal.

Figure 12A:
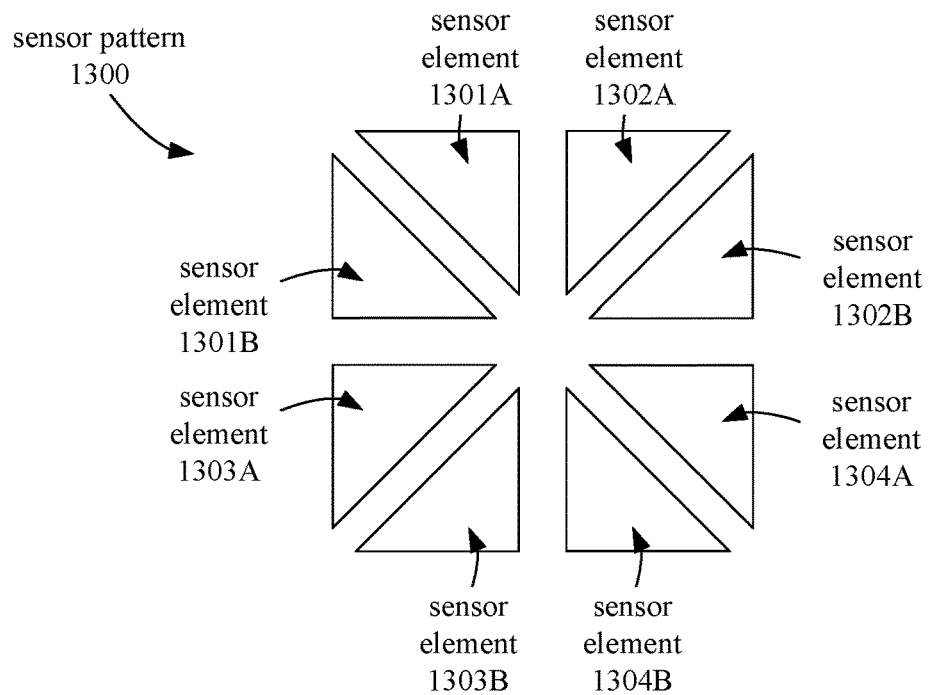
FIG. 12A illustrates a sensor pattern for a capacitance sensing button integrated circuit, according to an embodiment.
Figure 12B:
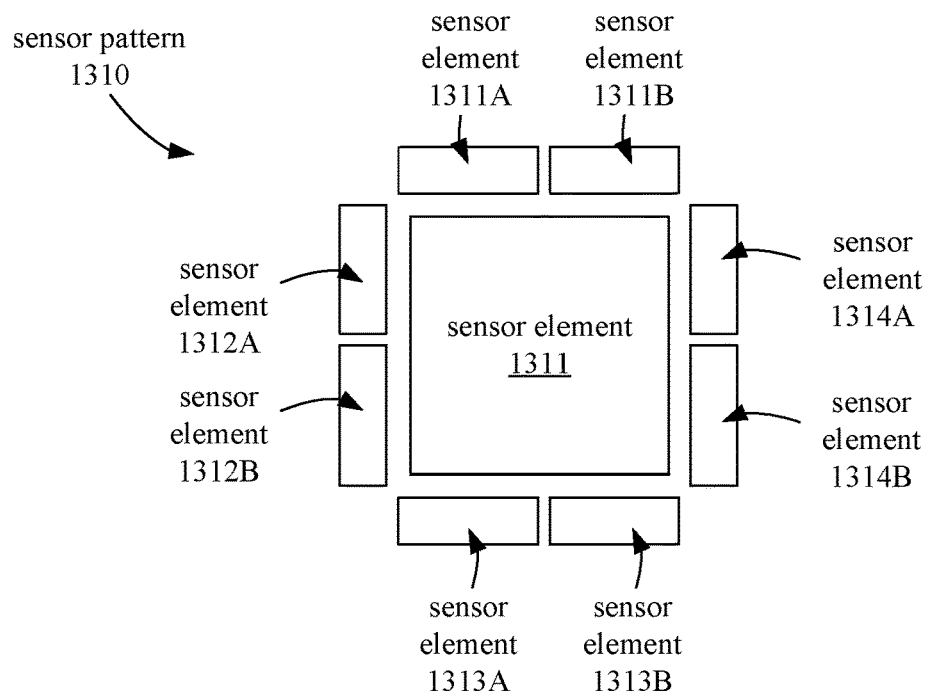
FIG. 12B illustrates a sensor pattern for a capacitance sensing button integrated circuit, according to an embodiment.

FIGS. 12A and 12B illustrate additional modifications to the sensor patterns 1200 and 1210. In particular, FIG. 12A illustrates a sensor pattern 1300 that is derived by further dividing each of the sensor elements 1201-1204 into two sensor elements each, resulting in the set of sensor elements 1301A-1304B. In one embodiment, a capacitive sensor button integrated circuit having this pattern of sensor elements may be used to implement a scroll wheel; a capacitive sensor controller within the integrated circuit may detect sequential changes in capacitances of the sensor elements 1301A-1304B as a conductive object moves in a clockwise or counter-clockwise direction around the center of the sensor pattern 1300. In one embodiment, the sensor pattern 1300 may be used in a capacitive sensor button integrated circuit that is configured to perform self-capacitance measurements of the sensor elements 1301A-1304B.

FIG. 12B illustrates a sensor pattern 1310 that is derived from sensor pattern 1210 by further dividing each of the radial sensor elements 1211-1214 into two sensor elements each, resulting in a set of sensor elements 1311A-1314B. In one embodiment, a capacitive sensor button integrated circuit having this pattern of sensor elements may be used to implement a scroll wheel; a capacitive sensor controller within the integrated circuit may detect sequential changes in capacitances of the sensor elements 1311A-1314B as a conductive object moves in a clockwise or counter-clockwise direction around the center of the sensor pattern 1310. In one embodiment, the sensor pattern 1300 may be used in a capacitive sensor button integrated circuit that is configured to perform mutual-capacitance measurements of the sensor elements 1311A-1314B. As with the sensor pattern 1210, the central sensor element 1311 may be used as an RX sensor element, while the radial sensor elements 1311A-1314B may be used as TX sensor elements. Alternatively, the central sensor element 1311 may be used as a TX sensor element, while the radial sensor elements 1311A-1314B are used as RX sensor elements.

In one embodiment, a sensing pattern does not need to be symmetric. In one embodiment, a sensor pattern may be designed with a single large sensor in the center resembling sensor pattern 1300 that is optimized for self-capacitance measurements. This central sensor pattern could additionally be surrounded by many radial TX sensor elements, such as sensor elements 1311A-1314B, which may be used for mutual-cap sensing. Such a combination pattern may be used in different modes for performing mutual or self-capacitance measurements.

In one embodiment, a mutual capacitance measurement method combined with a self-capacitance measurement method may improve the ability of the capacitance sensing system to reject false touches caused by water or other liquid on the capacitive touch-sensor. In one embodiment, combining both sensing methods can increase the effective resolution of the array of sensor elements. For example, for a 2×2 arrangement of sensor elements 1200, as illustrated in FIG. 11A, a mutual capacitance method results in a signal that is strongest near the edges of the sensor pattern. In the same sensor pattern, a self-capacitance measurement results in a signal that is strongest near the center of the pattern. Thus, in one embodiment, the use of mutual capacitance measurements in conjunction with self-capacitance measurements may effectively create four virtual sensor elements in addition to the four sensor elements 1201-1204. The capacitance data collected using both methods can thus be combined for a higher resolution.

Figure 13:
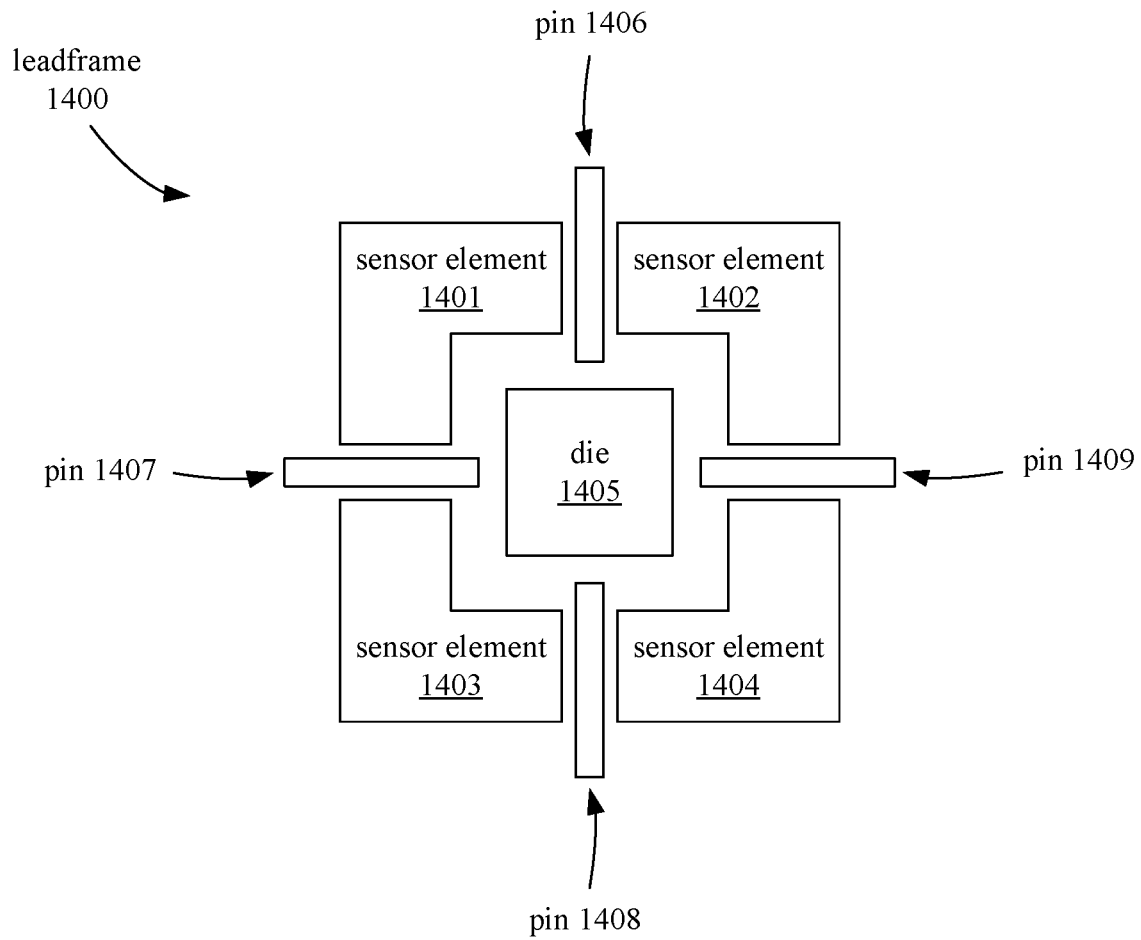
FIG. 13 illustrates a leadframe for a capacitance sensing button integrated circuit, according to an embodiment.

FIG. 13 illustrates a leadframe from which sensor element segments and package pins may be constructed, according to an embodiment. In one embodiment, the die may be mounted on a paddle in the center of an integrated circuit package. Four sensor elements 1401-1404 and four pins 1406-1409 (one for each of $V_{DD}$, $V_{SS}$, and I²C clock and data signals) may be constructed as parts of a leadframe 1400. In one embodiment, the central paddle for the die 1405 may be connected with the ground pin so that the central paddle may be supported prior to singulation. In an alternative embodiment, a single-wire or data-over-power-line communications link may be used, freeing one or more of the pins for supporting the central paddle prior to singulation.

Embodiments of the present invention, described herein, include various operations. These operations may be performed by hardware components, software, firmware, or a combination thereof. As used herein, the term "coupled to" may mean coupled directly or indirectly through one or more intervening components. Any of the signals provided over various buses described herein may be time multiplexed with other signals and provided over one or more common buses. Additionally, the interconnection between circuit components or blocks may be shown as buses or as single signal lines. Each of the buses may alternatively be one or more single signal lines and each of the single signal lines may alternatively be buses.

Certain embodiments may be implemented as a computer program product that may include instructions stored on a computer-readable medium. These instructions may be used to program a general-purpose or special-purpose processor to perform the described operations. A computer-readable medium includes any mechanism for storing or transmitting information in a form (e.g., software, processing application) readable by a machine (e.g., a computer). The computer-readable storage medium may include, but is not limited to, magnetic storage medium (e.g., floppy diskette); optical storage medium (e.g., CD-ROM); magneto-optical storage medium; read-only memory (ROM); random-access memory (RAM); erasable programmable memory (e.g., EPROM and EEPROM); flash memory, or another type of medium suitable for storing electronic instructions.

Additionally, some embodiments may be practiced in distributed computing environments where the computer-readable medium is stored on and/or executed by more than one computer system. In addition, the information transferred between computer systems may either be pulled or pushed across the transmission medium connecting the computer systems.

Although the operations of the method(s) herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. An integrated circuit package comprising:
   a first sensor element arranged within the integrated circuit package; and
   a controller arranged within the integrated circuit package and coupled to the first sensor element, wherein the controller is configured to:
   convert a self capacitance of the first sensor element to a digital value; and
   apply a signal to an output pin of the integrated circuit package based on the self capacitance.

2. The integrated circuit package of claim 1, further comprising a second sensor element arranged within the integrated circuit package and coupled to the controller, wherein the first sensor element is disposed in a first location of the integrated circuit package and the second sensor element is disposed in a second location of the integrated circuit package.

3. The integrated circuit package of claim 2, wherein the first and second sensor elements are arranged to implement at least one of a linear slider and a scroll wheel.

4. The integrated circuit package of claim 3, wherein the controller is configured to use digital values to determine a position of a conductive object.

5. The integrated circuit package of claim 2, wherein the controller is configured to measure the self capacitance of the first and second sensor elements simultaneously.

6. The integrated circuit of claim 1, wherein the controller is configured to receive a further receive signal from the second sensor element, wherein the further receive signal represents a mutual capacitance between the second sensor element and the first sensor element, wherein the controller is configured to use the digital value and the further receive signal to detect a presence of a conductive object.

7. The integrated circuit package of claim 1, wherein the controller is configured to detect change in the self capacitance of the first sensor element based on the digital value at a first time and the digital value at a second time.

8. The integrated circuit package of claim 1, further comprising an output pin coupled to the controller, the output pin configured to carry a signal that is based on the self capacitance of the first sensor element as coupled to a conductive object in proximity to the first sensor element.

9. The integrated circuit package of claim 1, further comprising a top layer overlying the first sensor element.

10. The integrated circuit package of claim 1, wherein the controller is formed on a die mounted underneath the first sensor element.

11. The integrated circuit package of claim 1, further comprising a lead frame coupled to the controller and configured to secure a substrate of the first sensor element.

12. A system comprising:
   a device including a user input space; and
   a circuit package disposed beneath the user input space, the circuit package comprising:
      a first sensor element located within the circuit package; and
      a logic circuitry located within the circuit package and coupled to the first sensor element wherein the logic circuitry is configured to:
         convert a self capacitance of the first sensor element to a first digital value; and
         apply a signal to an output pin of the integrated circuit package based on the self capacitance.

13. The system of claim 12, wherein the circuit package further comprises a second sensor element located within the circuit package, and wherein the logic circuitry is coupled to the second sensor element and configured to convert a second self capacitance of the second sensor element to a second digital value.

14. The system of claim 13, wherein the logic circuitry is configured to detect sequential changes in self capacitance of the first and second sensor elements.

15. The system of claim 14, wherein the first and second sensor elements are arranged to implement at least one of a linear slider and a scroll wheel.

16. The system of claim 12, wherein the circuit package further comprises an output pin coupled to the logic circuitry, the output pin configured to carry a signal that is based on the self capacitance and is associated with a conductive object proximate to the first sensor element.

17. The system of claim 12, wherein the circuit package further comprises a lead frame coupled to the logic circuitry and configured to secure a substrate of the first sensor element.

18. A method comprising:
   converting a first self capacitance on a first sensor element to a first charge, the first sensor element arranged within an integrated circuit package;
   integrating the first charge on a modulation capacitor to generate a modulation voltage;
   comparing the modulation voltage on the modulation capacitor to a threshold voltage; and
   generating a first digital value representative of the first self capacitance of the first sensor element based an output of the comparing; and
   apply a signal to an output pin of the integrated circuit package based on the self capacitance.

19. The method of claim 18, comprising using the digital value to implement a button function.

20. The method of claim 18 comprising:
   converting a second self capacitance on a second sensor element to a second charge, the second sensor element arranged within the integrated circuit package;
   integrating the second charge on a modulation capacitor to generate a modulation voltage;
   comparing the modulation voltage on the modulation capacitor to a threshold voltage; and
   generating a second digital value representative of the second self capacitance of the second sensor element based an output of the comparing.

* * * * *